United States Patent [19]
Tani et al.

[11] Patent Number: 5,483,879
[45] Date of Patent: Jan. 16, 1996

[54] PRINTER SYSTEM FOR PRINTING CIRCUIT PATTERNS OR LIKE ON BASE BOARD

[75] Inventors: Okie Tani, Tokyo; Takashi Nanzai, Fujisawa, both of Japan

[73] Assignee: Tani Electronic Industry Co., Ltd., Tokyo, Japan

[21] Appl. No.: 237,364

[22] Filed: May 3, 1994

[30] Foreign Application Priority Data

May 12, 1993  [JP]  Japan ................... 5-145326

[51] Int. Cl.$^6$ ................................. B41L 13/18
[52] U.S. Cl. ................ 101/123; 101/120; 101/425; 101/DIG. 34
[58] Field of Search .................... 101/119, 120, 101/123, 129, 425, 423, 424, DIG. 34; 118/406, 413

[56] References Cited

U.S. PATENT DOCUMENTS

| | | | |
|---|---|---|---|
| 1,142,019 | 6/1915 | Buettner | 101/DIG. 34 |
| 1,896,034 | 1/1933 | Weed | 101/DIG. 34 |
| 3,302,564 | 2/1967 | Wilford | 101/123 |
| 3,903,414 | 9/1975 | Zimmer et al. | 101/DIG. 34 X |
| 3,921,521 | 11/1975 | Kudlich | 101/120 |
| 4,023,486 | 5/1977 | Linthicum et al. | 101/120 |
| 4,078,486 | 3/1978 | Moser | 101/120 |
| 4,307,662 | 12/1981 | Mitter | 101/123 |
| 4,485,736 | 12/1984 | Strutz, Jr. et al. | 101/123 |
| 5,095,816 | 3/1992 | Hasegawa et al. | 101/119 |
| 5,197,384 | 3/1993 | Yawata et al. | 101/123 |
| 5,287,806 | 2/1994 | Nanzai | 101/123 |

FOREIGN PATENT DOCUMENTS

| | | | |
|---|---|---|---|
| 0460267 | 12/1991 | European Pat. Off. | |
| 2365441 | 4/1978 | France | |
| 2250092 | 4/1974 | Germany | |
| 3115399 | 4/1982 | Germany | |
| 0172647 | 7/1988 | Japan | 101/120 |
| 80/02399 | 11/1980 | WIPO | |

Primary Examiner—Christopher A. Bennett
Attorney, Agent, or Firm—Foley & Lardner

[57] ABSTRACT

A printer system for printing a given pattern on a base board is described which includes a screen plate to be positioned above the base board. The screen plate has a perforated print pattern defined thereby. A printer proper is employed which includes an ink container chamber and an ink squeegeeing device. The ink squeegeeing device runs on the screen plate pressing the same against the baseboard while squeegeeing a given amount of viscous ink onto an upper surface of the screen plate. A cleaning device is employed for cleaning residual of ink left on an lower surface of the screen plate and an ink supplier is employed for feeding the ink container chamber of the printer proper with a fresh viscous ink when needed.

18 Claims, 22 Drawing Sheets

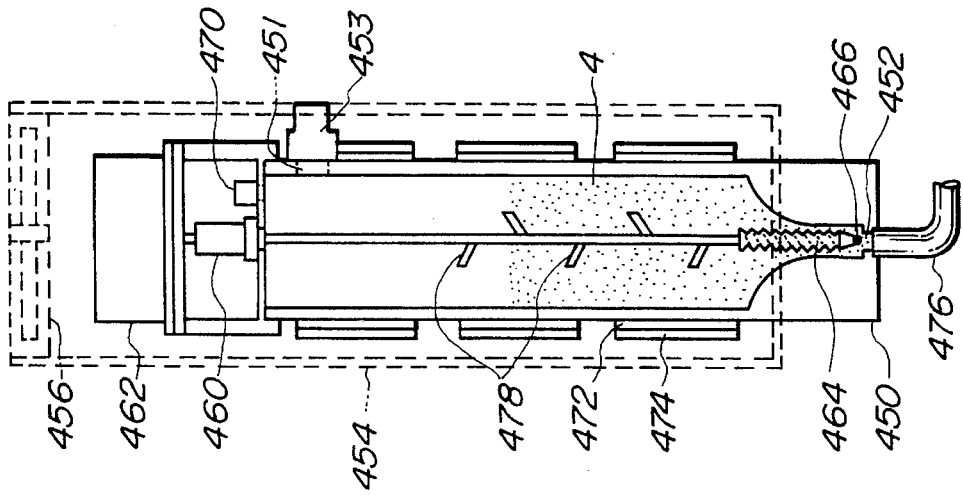
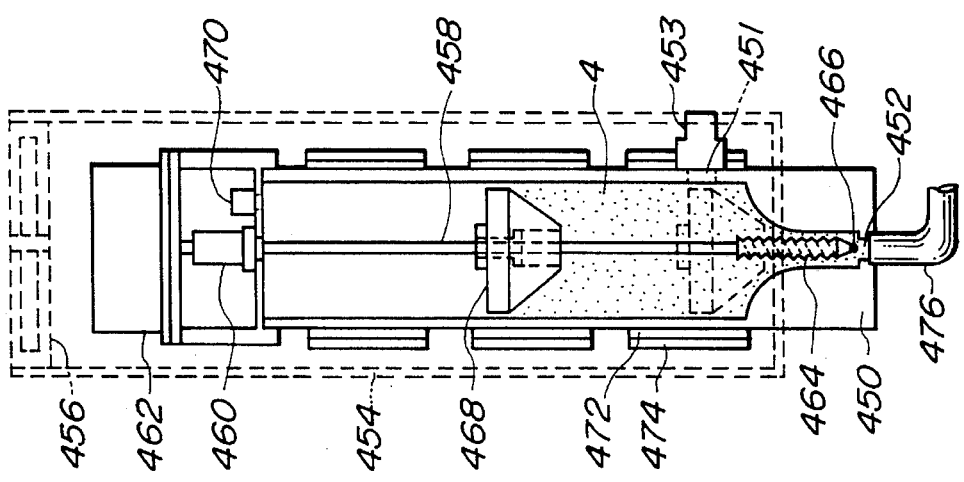

PRINTER SYSTEM FOR PRINTING CIRCUIT PATTERNS OR LIKE ON BASE BOARD

BACKGROUND OF THE INVENTION

1. Field of the Invention

The present invention relates in general to printer systems, and more particularly to printer systems for printing electric circuit patterns on an insulating baseboard. More specifically, the present invention is concerned with printer systems of a type which generally comprises a printer device of so-called "screen print type" which prints on an insulating base board an electric circuit through a screen plate, a screen plate cleaning device which cleans the screen plate and an ink supplier which feeds the printer device with a viscous inductive ink.

2. Description of the Prior Art

Hitherto, various types of printer systems have been proposed and put into practical use particularly in the field of printed circuit manufacture. Some of them are of a type which employ a so-called "screen print type printer". This type printer device comprises, generally, a screen plate, which is set on an insulating base board to be printed, and an ink squeegeeing device which runs on the screen plate while squeegeeing a given amount of viscous conductive ink onto the screen plate and pressing the same against the insulating base board. With this, on the surface of the insulating base board, there is printed a desired circuit pattern of the conductive ink, which coincides with a perforated print pattern formed in the screen plate. The base board is then heated for fixing the printed circuit pattern. The screen plate is usually constructed of a stainless steel, silk or the like.

For clarifying the present invention, some of conventional printer systems using the screen print type printer device will be described in brief.

Japanese Patent Application 2-419135 shows an ink squeezing device (that will be referred to hereafter as a squeegeeing device) usable in such printer devices. The ink squeegeeing device comprises generally a pair (viz., front and rear) of metal blades which have lower ends contactable with an upper surface of the screen plate, an ink container housing which is located between the paired blades and has an ink outlet opening through which a viscous conductive ink in the housing is squeezed toward the blades, and a shutter mechanism which opens the ink outlet opening when printing is needed and closes the opening when not needed. Only when the ink container housing is advanced for carrying out printing, the lower ends of the paired blades are brought into contact with the upper surface of the screen plate and one of the blades, which is the trailing one serves as a squeegeeing blade. However, due to inherent construction, the printer device of the application has some drawbacks which are as follows. First, due to the repeated frictional contact carried out between the metal blades and the screen plate, one or both of them tend to have a marked abrasion within a shorter time, which thus shortens the lifetime of them. The lifetime of them is further shortened when the ink contains pewter particles. In fact, during printing operation, the pewter particles get into a space between the blade tips and the screen plate, and thus abrade them. In order to solve this drawback, a measure has been hitherto proposed in which plastic blades are used in place of the conventionally used metal blades. However, in this measure, due to the nature of the plastic which is the material of the blades, it is difficult to press the tips of the blades against the screen plate with a satisfied pressing force. By this reason, the pewter particles in the ink tend to separate from the flux of the ink during movement of the blades on the screen plate, resulting in that the pewter particles are left in the perforations of the screen plate thereby lowering the printing quality of the printer device. Of course, in order to obtain a satisfied pressing force with which the blades are pressed against the screens plate. Another measure may be thought out in which both the screen plate and the blades are constructed thicker in size. However, in this case, it becomes very difficult to form the screen plate with a very fine perforated print pattern. Furthermore, if the blade pressing force is extremely high, the perforations of the screen plate are easily deformed and finally broken. Furthermore, the printer device fails to provide the squeegeeing blade with an stable squeegeeing operation. In fact, during movement of the squeegeeing blade on the screen plate, the pressing force of the blade against the screen plate fluctuates markedly, which lowers the printing quality.

Japanese Patent Application 2-419135 as mentioned hereinabove, and Japanese Utility Model Application 3-77831 show a roller installed in the ink container housing of the printer, which has two functions, one being to stir up the viscous ink in She ink container housing when the ink outlet opening is closed and the other being to press out the ink when the ink outlet opening is open. However, repeated experiments and tests have revealed that a satisfied stirring of the ink is not obtained from such roller particularly when the viscosity of the ink is high. In fact, when treating such highly viscous ink, the stirring effect on the ink at a distance from the rotating roller is quite low.

Some Japanese Patents and Patent Provisional Publications show a screen plate cleaning device for cleaning the screen plate, which functions to remove residual ink left on the screen plate. Some are of a one-way trip type, in which sweeping action is carried out once per each cleaning, and some are of a round trip type, in which the sweeping action is carried out twice. However, due to the nature of the residual ink the cleaning devices of these types fail to exhibit a satisfied cleaning performance.

Other Japanese Patents and Patent Provisional Publications show an open type ink containing chamber defined by the ink container housing. That is, the chamber is constructed to be exposed to the open air. However, in this case, the ink in the chamber is easily affected by the surrounding air. In fact, under such open condition, the ink easily loses volatile components and thus the viscosity of the ink changes or increases instantly. Furthermore, the ink is easily oxidized, which changes the nature of the ink.

Other Japanese Patents and Patent Provisional Publications show an ink supplier which feeds the printer device with viscous ink. However, due to inherent constructions, the ink suppliers shown by such documents fail to exhibit a satisfied ink supplying performance.

SUMMARY OF THE INVENTION

It is therefore an object of the present invention to provide a printer system for printing circuit patterns or the like on a base board through a screen plate, which is free of the above-mentioned drawbacks.

According to a first aspect of the present invention, there is provided a printer system for printing a given pattern on a base board, which comprises a screen plate to be positioned above the base board, the screen plate having a perforated print pattern defined thereby; a printer proper including an ink container chamber and an ink squeezing or squeegeeing device, the ink squeegeeing device running on the screen plate pressing the same against the base board while squeegeeing a given amount of viscous ink onto an upper surface of the screen plate; a cleaning device for cleaning residual amount of ink left on an lower surface of the screen plate; and an ink supplier for feeding the ink container chamber of the printer proper with a fresh viscous ink when needed.

According to a second aspect of the present invention, there is provided a printer device for printing a given pattern on a base board through a screen plate, which comprises a housing having an ink container chamber defined therein, the housing including a fixed wall and a pivotal wall which is pivotal relative to the fixed wall; first and second inclined blades respectively connected to lower portions of the pivotal and fixed walls, the first and second inclined blades forming therebetween an ink outlet opening when the pivotal wall is pivoted away from the fixed wall, the firsthand second inclined blades having respective tips which can be pressed against an upper surface of the screen plate; a shutter mechanism for selectively opening and closing the ink outlet opening by pivoting the pivotal wall; a roller rotatably disposed in the ink container chamber for applying a certain force to a viscous ink in the ink container chamber; and a reversible electric motor for driving the roller.

According to a third aspect of the present invention, there is provided a cleaning device for cleaning a screen plate, which comprises a pivotal holding unit having two upwardly extending arm portions; first and second scraping blades respectively held by the arm portions, the blades having respective tips, one of which becomes contact with a lower surface of the screen plate when the pivotal holding unit is inclined; means for moving the pivotal holding unit along the axis of the screen plate; means for pivoting the pivotal holding unit; a suction pump; and means for connecting the interior of the pivotal holding unit and an inlet of the suction pump.

According to a fourth aspect of the present invention, there is provided an ink supplier for feeding a printer device with a fresh viscous ink, which comprises first means for defining a cylindrical chamber in which the fresh viscous ink is to be contained; tube means for providing a fluid connection between the cylindrical chamber and an ink container chamber defined in the printer device; and means for forcing the fresh viscous ink to flow toward the ink container chamber through the tube means.

BRIEF DESCRIPTION OF THE DRAWINGS

Other objects and advantages of the present invention will become apparent from the following description when taken in conjunction with the accompanying drawings, in which:

FIGS. 39 to 44 are sectional views of second to seventh modifications of the ink supplier.

DETAILED DESCRIPTION OF THE INVENTION

In the following, the printer system of the present invention will be described in detail with reference to the accompanying drawings.

Referring to FIGS. 1 to 11 of the drawings, there is shown a printer device employed in the printer system of the present invention.

Figure 1:
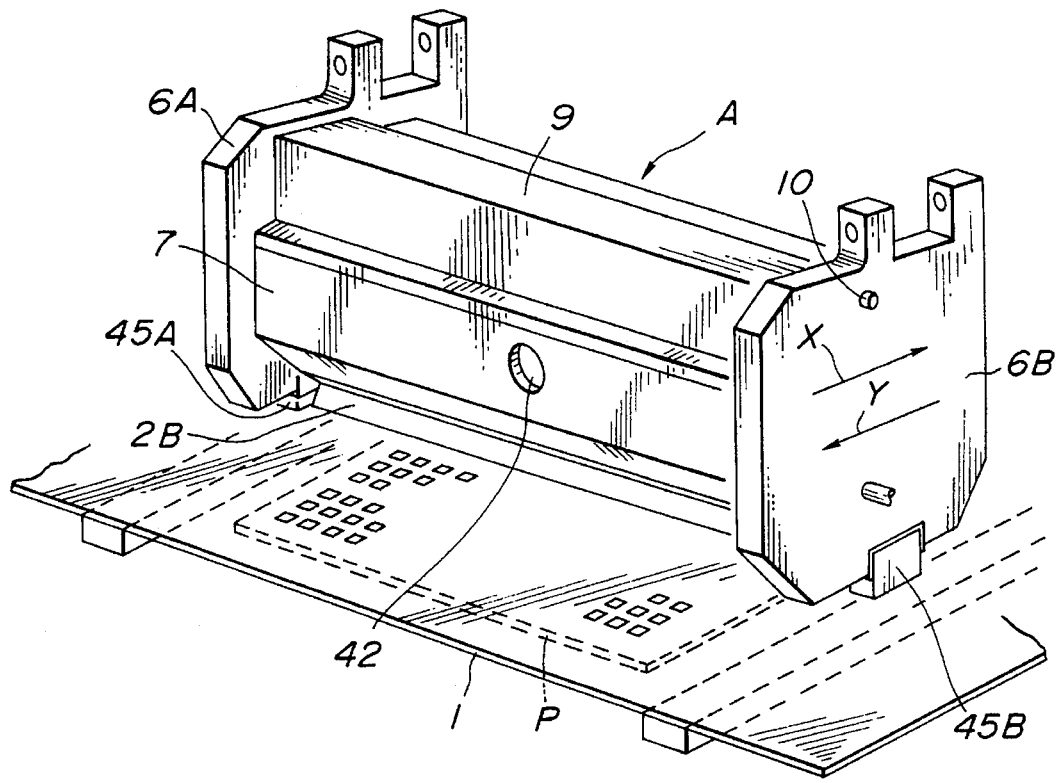
FIG. 1 is a perspective view of a printer device which is employed in a printer system of the present invention.
Figure 2:
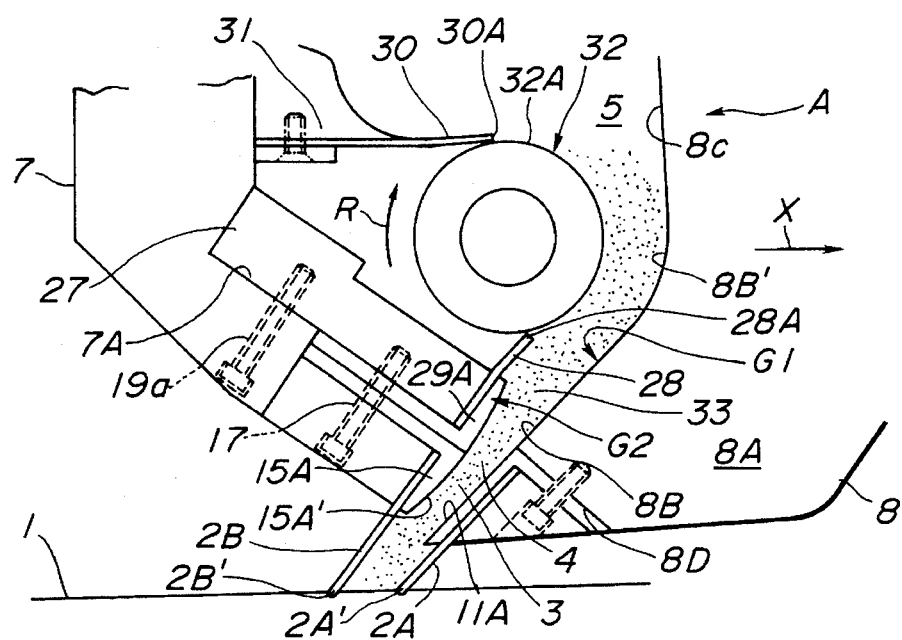
FIG. 2 is a schematically illustrated side view of the printer device.

In the drawings, particularly in FIGS. 1 and 2, denoted by reference "A" is a housing which has an ink container chamber 5 formed therein. The housing A has at its bottom portion a laterally extending ink outlet opening 3 through which a viscous conductive ink 4 (or pewter paste) is put out. A pair (viz., front and rear) of blades 2A and 2B are connected to the bottom portion of the housing "A" in a manner to locate therebetween the elongate outlet opening 3 and extend along the same. As will become apparent as the description proceeds, under printing operation, tips 2A' and 2B' of the blades 2A and B are forced into contact with an upper surface of a screen plate 1, which is arranged below the printer device. Positioned below the screen plate 1 is an insulating base board "P" on which a given circuit pattern is to be printed.

A shutter mechanism "B" (see FIGS. 7 and 8) is incorporated with the housing "A", which functions to open the elongate outlet opening 3 when printing is needed and close the opening 3 when not needed. Although not shown in the drawings, a printer device mover is also associated with the housing "A" to move the housing "A" in fore-and-aft direction, that is, in the direction of arrows "X" and "Y" in FIG. 1. As will become apparent as the description proceeds, only when the housing "A" is moved in the direction of the arrow "X" for carrying out printing, one (viz., the trailing blade 2B) of the blades 2A and 2B serves as a squeegeeing blade, as will be understood from FIG. 2.

As is seen from FIGS. 1 and 2, the housing "A" comprises a pair of side walls 6A and 6B, a rear wall 7 having both ends secured to the side walls 6A and 6B, a front wall 8 pivotally held at its upper portion by the side walls 6A and 6B, and a lid 9 detachably mounted to upper portions of the four walls 6A, 6B, 7 and 8. Thus, the housing "A" has a chamber 5 defined by the four walls and the lid 9. Designated by numeral 10 in FIG. 1 is a pivot shaft which is held by the side walls 6A and 6B for pivoting the front wall 8.

As is seen from FIGS. 2 to 6, the fixed rear wall 7 has a lower portion which extends obliquely downward toward a lower portion of the pivotal front wall 8. The rear wall 7 has a stepped inner surface 7A. The pivotal front wall 8 has a lower portion 8A which extends obliquely downward toward the lower portion of the rear wall 7. As is seen from FIG. 2, the lower portion 8A has an inclined inner surface 8B which extends to an upper vertical inner surface 8C of the front wall 8 through a curved inner surface 8B'. Designated by numeral 8D is an inclined lower surface of the lower portion 8A, which is generally perpendicular to the inclined inner surface 8B.

As shown, the front blade 2A is secured to the pivotal front wall 8 and the rear blade 2B is secured to the rear wall 7. These front and rear blades 2A and 2B extend obliquely, that is, downward rearward with respect to the direction of the arrow X. As will be described hereinafter, the pivotal front wall 8 is actuated by the shutter mechanism "B". Each blade 2A or 2B is constructed of a resilient metal, such as spring steel and the like. Each blade 2A or 2B has a smoothly rounded tip 2A' and 2B' for minimizing the frictional force produced when slidably engaged with the Screen plate 1. Preferably, the thickness of each blade 2A or 2B is smaller than 0.5 mm. If the blade is made of a spring steel, the thickness of the blade can be reduced to 0.1 to 0.05 mm.

Figure 3:
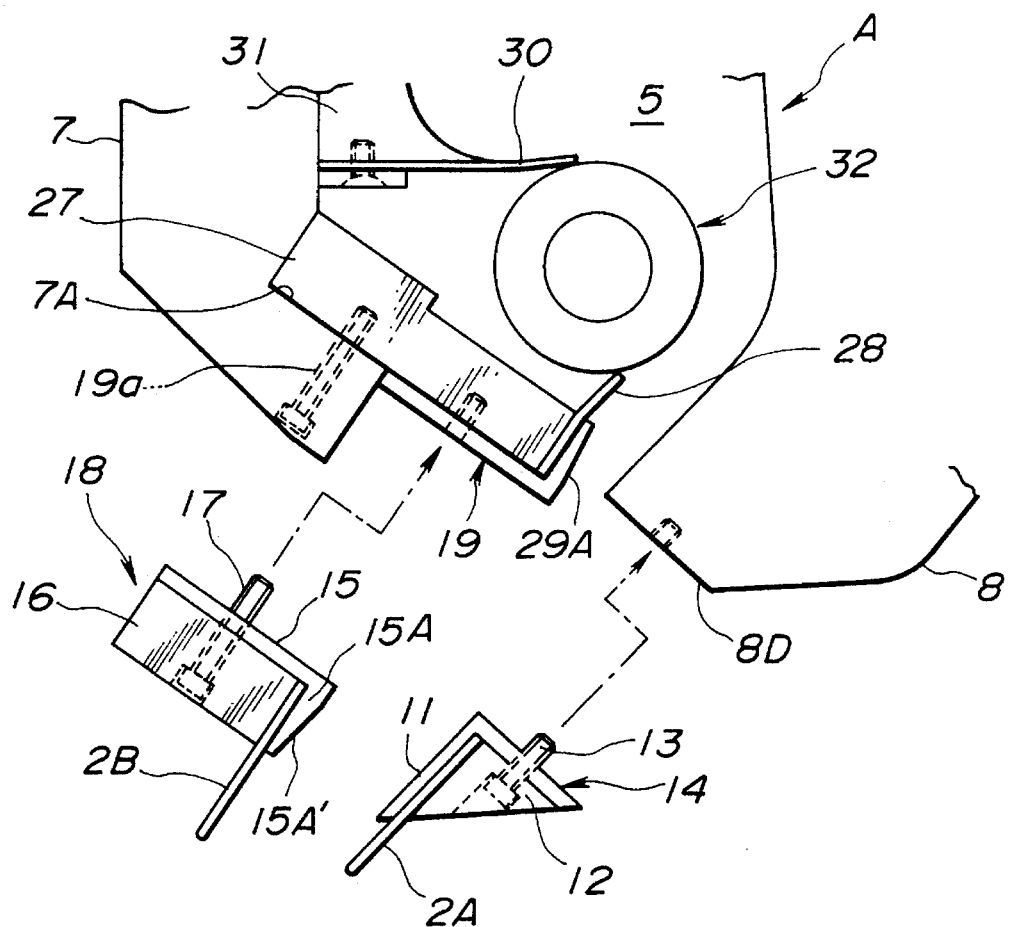
FIG. 3 is a view similar to FIG. 2, showing a pair of blades dismantled from a major portion of the printer device.

As is shown in FIG. 3, in order to mount the front blade 2A to the pivotal front wall 8, a first clamp assembly 14 is used, which comprises an outer elongate mounting member 11 of generally L-shaped cross section, an inner elongate mounting member 12 of generally triangular cross section, and a plurality of connecting bolts 13. Before being mounted to the front wall 8, the front blade 2A is tightly clamped by the clamp assembly 14, as shown in FIG. 3, and then the clamp assembly 14 is secured to the inclined lower surface 8D of the front wall 8 by screwing the connecting bolts 13 into associated threaded bores (no numerals) formed in the front wall 8. As is seen from FIG. 2, when the clamp assembly 14 is properly secured to the front wall 8, one surface 11A of the outer elongate mounting member 11 is flush with the inclined inner surface 8B.

As is shown in FIG. 3, in order to mount the rear blade 2B to the fixed rear wall 7, a second clamp assembly 18 is used, which comprises an outer elongate mounting member 15 of generally L-shaped cross section, an inner elongate mounting member 16 of generally rectangular cross section and a plurality of connecting bolts 17. Before being mounted to the rear wall 7, the rear blade 2B is tightly clamped by the clamp assembly 18 and then the clamp assembly 18 is secured by means of the connecting bolts 17 to a third clamp assembly 19 which has been secured to the fixed rear wall 7. As shown, the third clamp assembly 19 is neatly set in a recess defined by the stepped inner surface 7A of the rear wall 7. Of course, if desired, as is understood from FIG. 4, before being mounted to the rear wall 7, the two clamp assemblies 18 and 19 may be coupled to constitute one unit 20, and then the unit 20 is secured to the rear wall 7 by means of a plurality of connecting bolts 19a. As shown, the connecting bolts 19a pass through bores formed in the rear wall 7 and are engaged with threaded bores formed in an inner elongate member 27 of the third clamp assembly 19.

Figure 4:
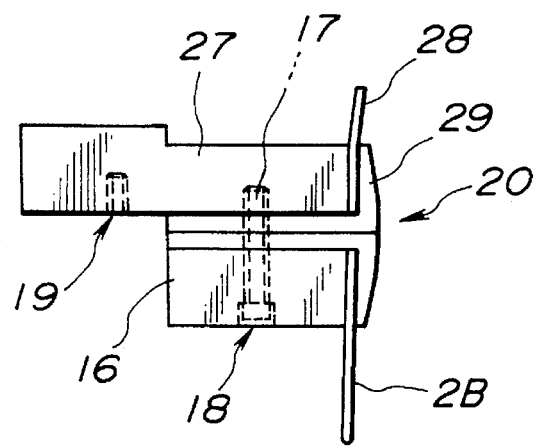
FIG. 4 is a side view of a unit consisting two clamp assemblies which hold a squeegeeing blade of the printer device.

As is shown in FIG. 4, the third clamp assembly 19 comprises an outer elongate member 29 of generally L-shaped cross section, the inner elongate member 27 of generally rectangular cross section and the connecting bolts 19a. The third clamp assembly 19 has a first partition blade 28 of steel clamped thereby, which extends into the chamber 5 of the housing "A" for the purpose which will be described hereinafter.

As will be understood from FIGS. 2 and 3, upon assembly, shorter walls 15A and 29A of the outer elongate mounting members 15 and 29 face toward an inclined inner surface, which includes the surface 11A of the outer elongate mounting member 11 and the inclined inner surface 8B.

It is to be noted that when the pivotal front wall 8 is pivoted clockwise in FIG. 2 to a given angular position, the surface 11A of the first clamp assembly 14 connected to the front wall 8 becomes in contact witch the surface 15A' of the shorter wall 15 of the second clamp assembly 18. Under this condition, the ink outlet opening 3 is closed.

As is seen from FIG. 2, denoted by numeral 30 is a second partition blade of steel which extends into the chamber 5 of the housing "A" from the fixed rear wall 7. That is, the second partition blade 30 is bolted to a mounting block 31 secured to an inner surface of the rear wall 7. Leading ends 28A and 30A of the first and second partition blades 28 and 30 are pressed against an outer cylindrical surface of an elongate roller S2 which is rotatably held in the chamber 5 of the housing "A".

Figure 5:
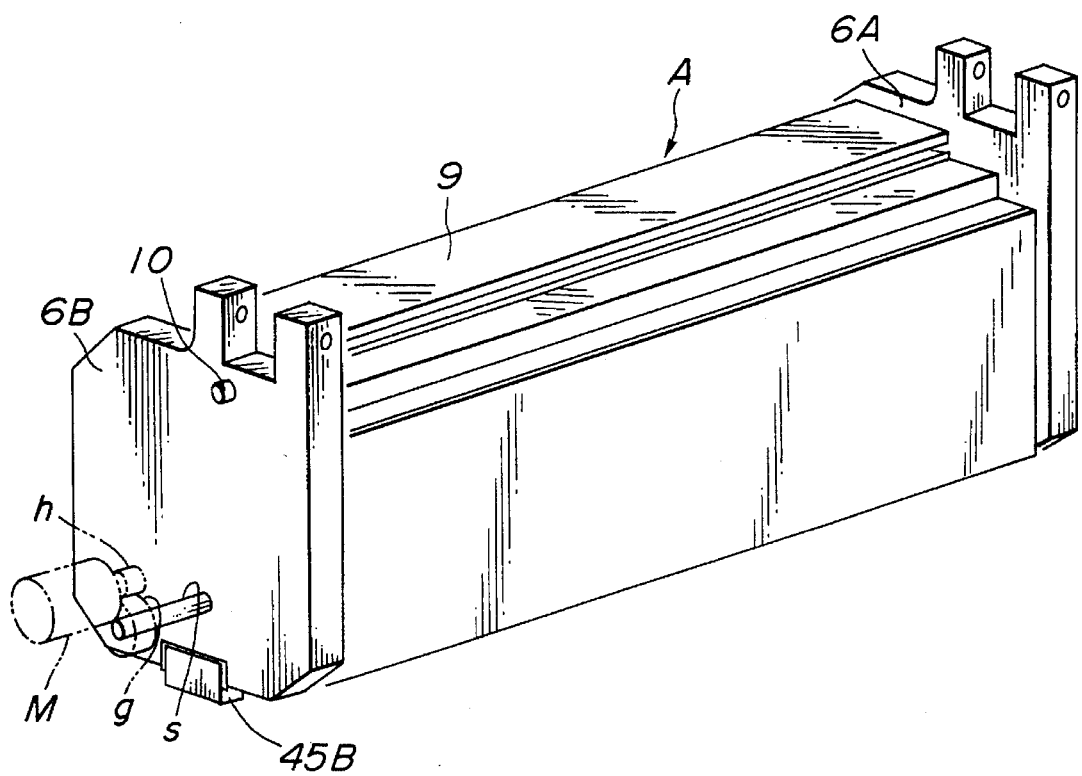
FIG. 5 is a perspective view of the printer device, showing a back side of the same.
Figure 6:
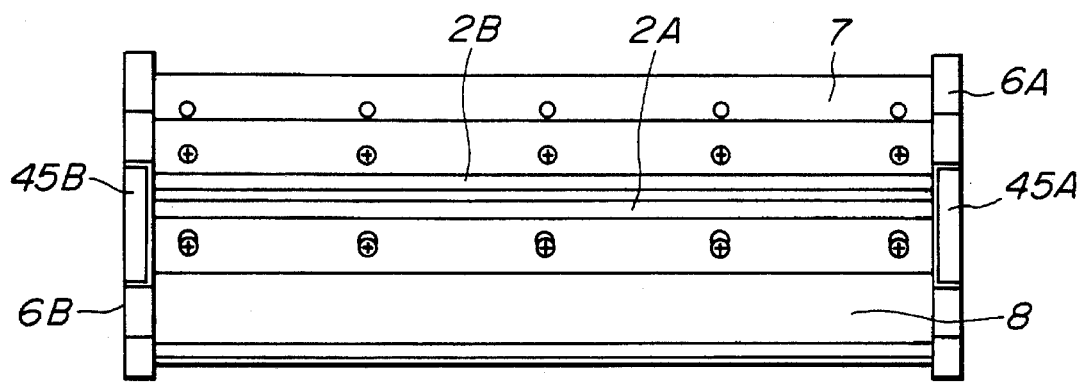
FIG. 6 is a bottom view of the printer device.

As is seen in FIG. 5, the roller 32 is coaxially mounted on a rotating shaft "S" which is rotatably held by the side walls 6A and 6B of the housing "A". The shaft "S" has a gear "g" meshed with an output gear "h" driven by a reversible electric motor "M". Thus, upon enegization of the motor "M", the roller 32 is rotated in the chamber 5.

Thus, as is seen from FIG. 2, a part 32A of the cylindrical outer surface of the roller 32, the partition blade 28, the shorter wall 29A, the shorter wall 15A and the second blade 2B constitute a second guide wall G2. While, the upper vertical inner surface 8C, the curved inner surface 8B', the inclined inner surface 8B, the surface 11A and the first blade 2A constitute a first guide wall G1. That is, between the first and second guide walls G1 and G2, there is defined a narrow passage 33 which extends from the ink containing chamber 5 toward the first and second blades 2A and 2B.

Accordingly, when, under rotation of the roller 32 in the direction of the arrow "R" (see FIG. 2), the front pivotal wall 8 is pivoted to open the outlet opening 3 by the shutter mechanism "B", the viscous conductive ink 4 in the chamber 5 is forced to flow downward in and along the narrow passage 33 and discharged onto the screen plate 1.

While, when the roller 32 is rotated in a reversed direction, the viscous ink 4 is prevented from making a downward flow in the narrow passage 33 due to interruption by the roller 32. Thus, when the reversed rotation of the roller 32 starts just before the closing of the outlet opening 3, undesired leakage of the ink 4 from the outlet opening 3 is assuredly prevented. If desired, a speed changer may be arranged between the motor "M" and the roller 32.

Figure 7:
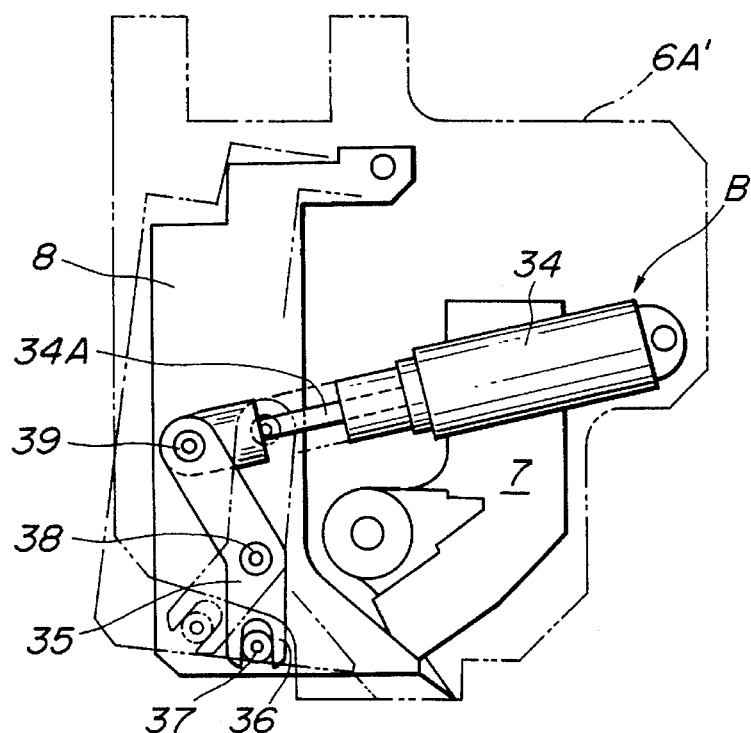
FIG. 7 is a schematically illustrated side view of a shutter mechanism which functions to selectively open and close an ink outlet opening formed in the printer device.
Figure 8:
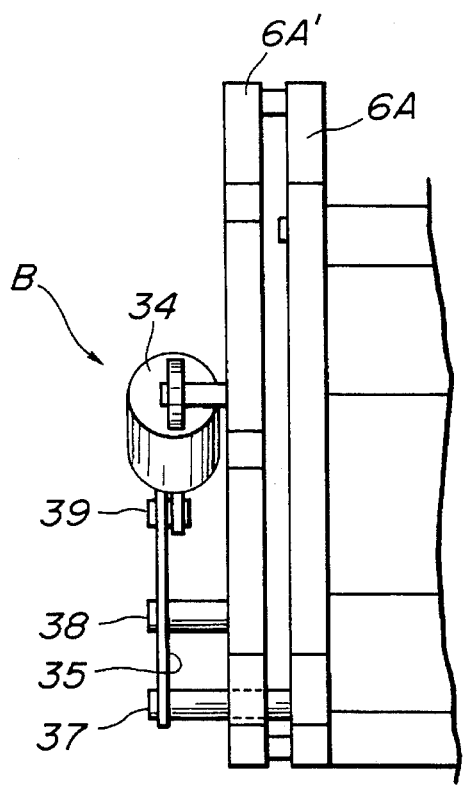
FIG. 8 is a front and partial view of the shutter mechanism.
Figure 9:
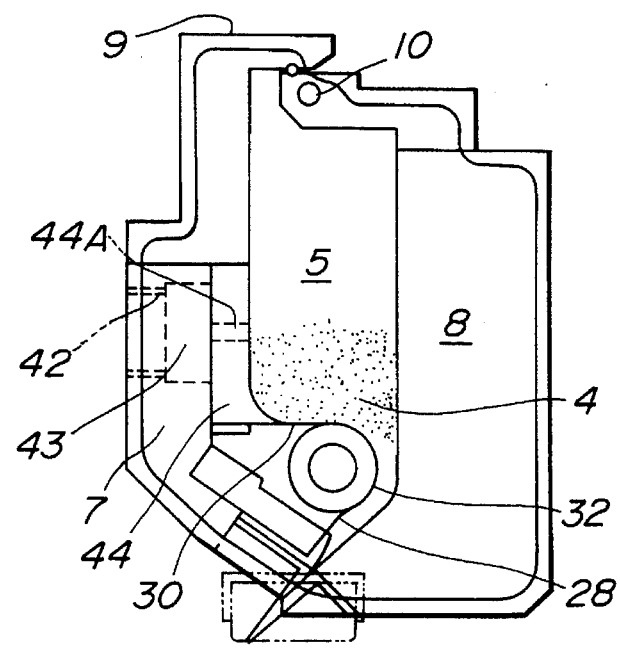
FIGS. 9 and 10 are side views of the printer device, showing different operation conditions of the same.
Figure 10:
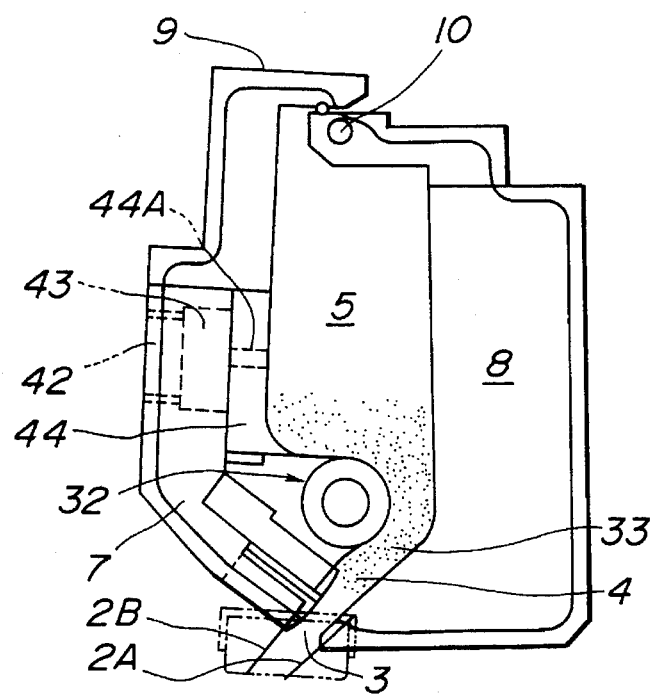
Figure 11:
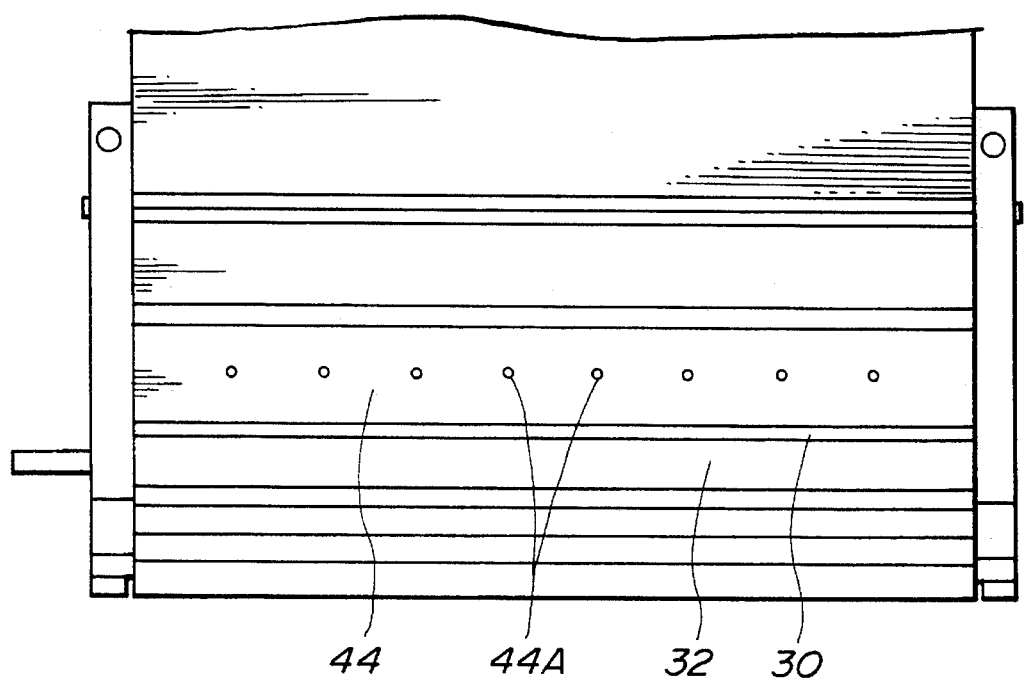
FIG. 11 is a front view showing the interior of an ink container housing of the printer device.

As is seen from FIGS. 7 and 8, the shutter mechanism "B" comprises an air cylinder 34 mounted on a mounting plate 6A' which is secured to the side wall 6A. A piston rod 34A from the cylinder 34 is pivotally connected through a pin 39 to one end of a bell crank 35. The bell crank 35 is pivotally connected at its middle portion to the mounting plate 6A' through a shaft 38. The other end of the bell crank 35 is formed with a forked portion 36 which is slidably engaged with a pin 37 which extends from the pivotal front wall 8. Accordingly, when the piston rod 4A is pulled by the air cylinder 34, the bell crank 35 pivots the front wall 8 in a direction to open the ink outlet opening 3. While, when the piston rod 34A is pushed by the air cylinder 4, the bell crank 35 pivots the front wall 8 in a reversed direction thereby to close the ink outlet opening 3.

Referring back to FIG. 1, denoted by numeral 42 is an ink inlet opening which is formed in the fixed rear wall 7. Although not shown in the drawing, a tube extending from an ink supplier is connected to the ink inlet opening 42. As is seen from FIG. 9, the opening 42 is merged with a laterally extending recess 43 formed in an inner surface of the rear wall 7. The recess 43 has substantially the same length as the roller 32. The recess 43 is covered by an elongate member 44 which has a plurality of nozzles 44A (see FIG. 11) through which the interior of the recess 43 and the ink containing chamber 5 are communicated. Thus, upon energization of the ink supplier, the viscous ink 4 is led into the recess 43 and then led into the ink containing chamber 5 through the nozzles 44A, In FIGS. 1 and 5, denoted by numerals 45A and 45B are leak stoppers which are mounted to lower ends of side walls 6A and 6B in a manner to contact to both ends of the front and rear blades 2A and 2B. That is, each stopper 45A or 45B hermetically contacts with one longitudinal end of each blade 2A or 2B.

Figure 12:
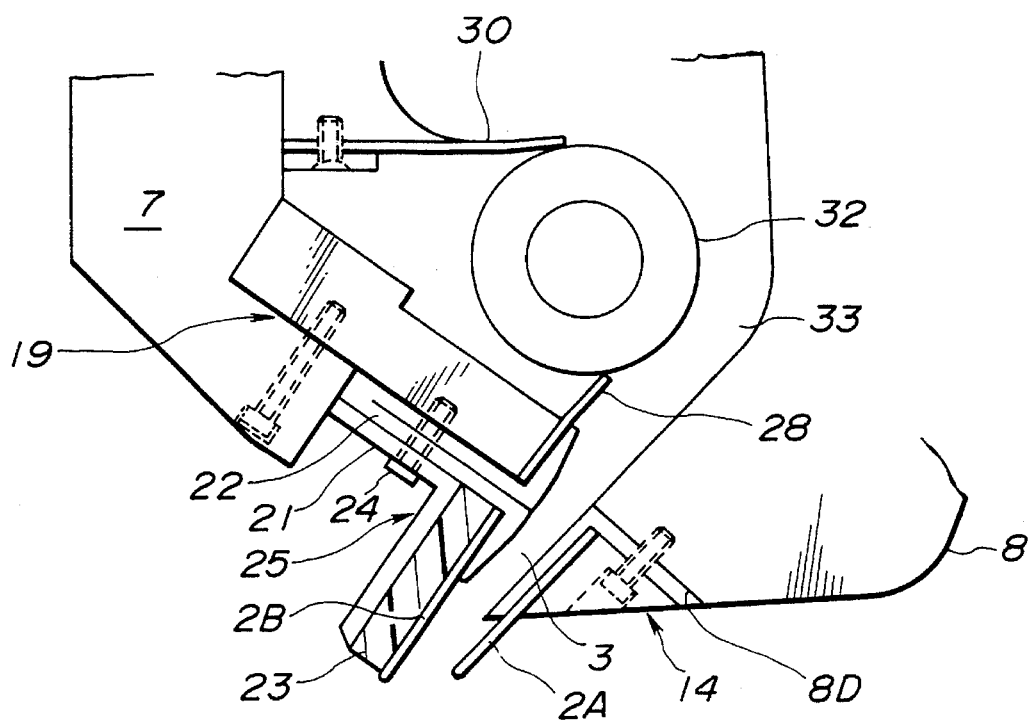
FIG. 12 is a view similar to FIG. 2, showing a first modification of the printer device which is usable in the printer system of the present invention.
Figure 13:
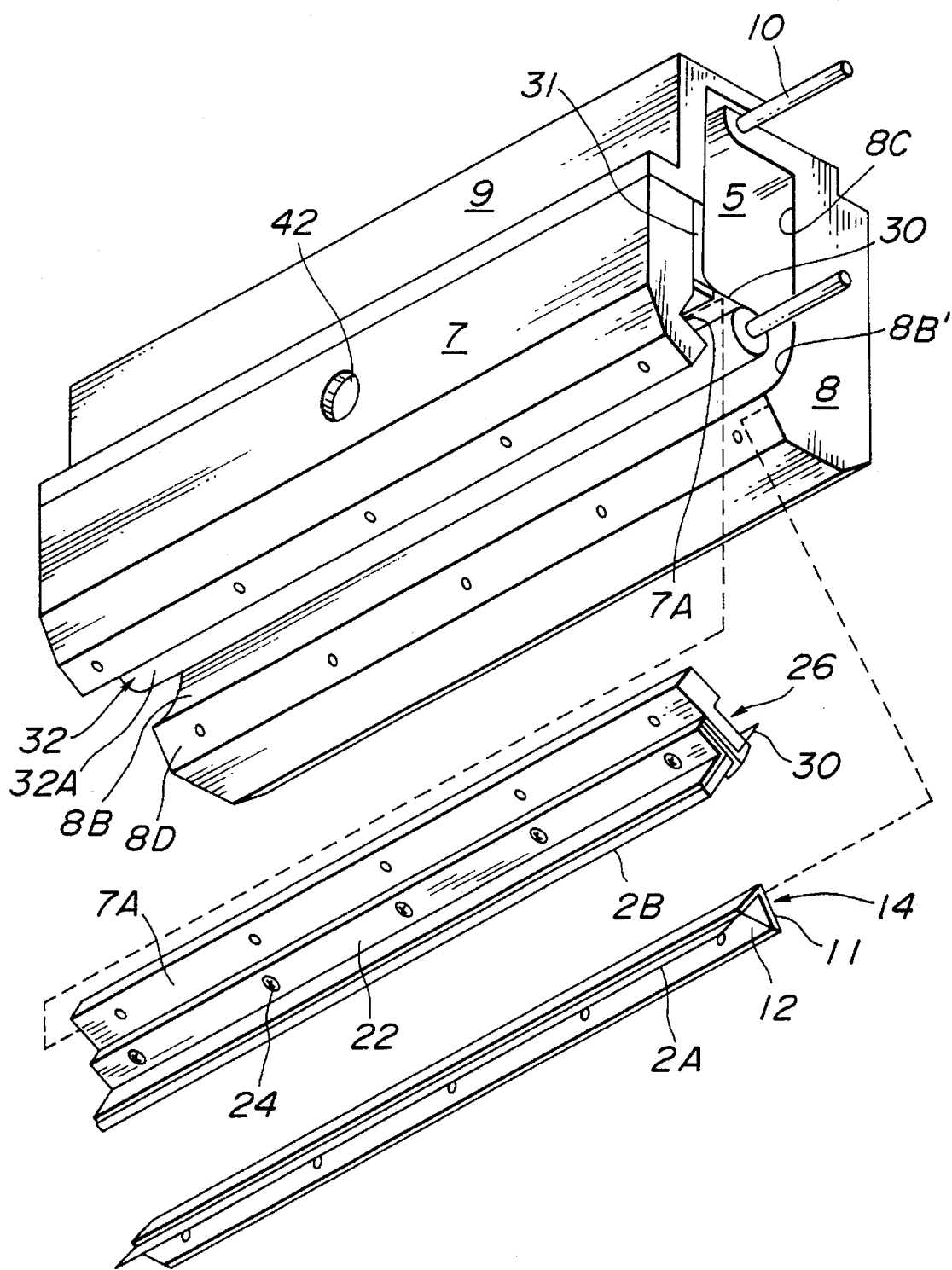
FIG. 13 is a perspective view of the modified printer device with two blades dismantled from a major portion of the device.
Figure 14:
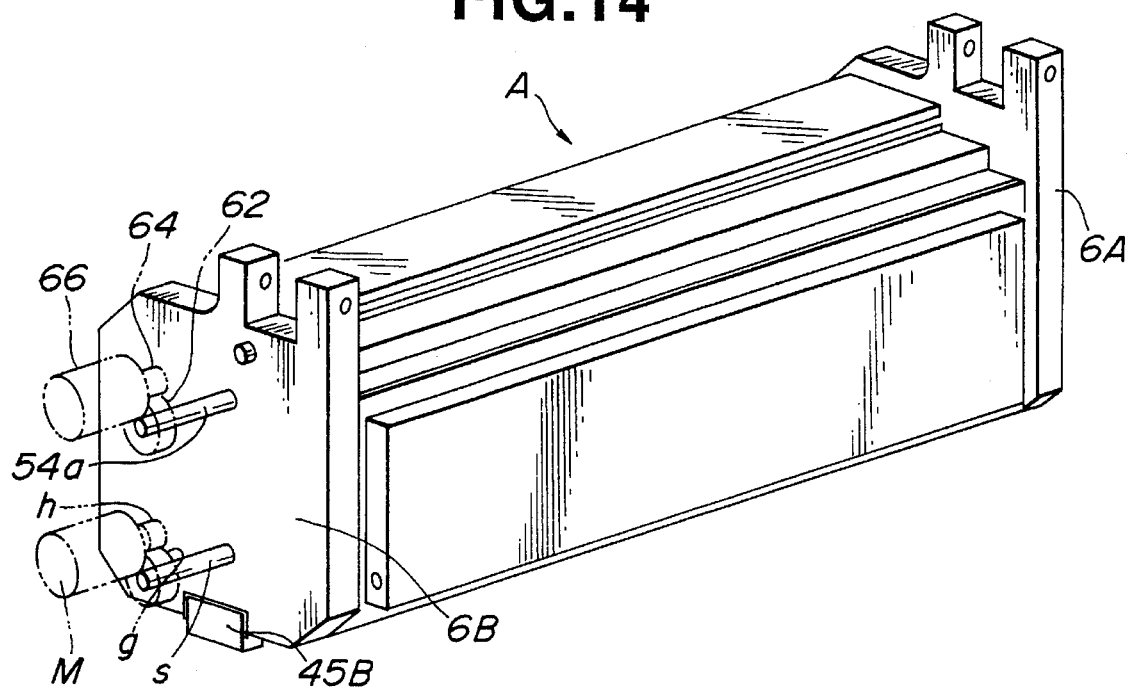
FIG. 14 is a view similar to FIG. 5, showing a second modification of the printer device which is also usable in the printer system of the present invention.

Referring to FIGS. 12 and 13, there is shown a first modification of the printer device which is employable in the printer system of the present invention. Since the construction of this first modification is similar in construction to that of the above-mentioned printer device, only parts and constructions which are different from those of the above-mentioned one will be described in the following.

In this first modification of the printer device, in order to mount the rear blade 2B to the fixed rear wall 7, a modified clamp assembly 25 is used as a substitute for the above-mentioned second clamp assembly 18. The clamp assembly 25 comprises a first elongate mounting member 21 of generally L-shaped cross section, a second elongate mounting member 22 of generally L-shaped cross section, an elongate cushion member 23 constructed of an elastic material, such as plastic, rubber or the like, and a plurality of connecting bolts 24. Before being mounted to the rear wall 7, the rear blade 2B and the cushion member 23 are clamped by the clamp assembly 25 as shown, and then the clamp assembly 25 is secured by means of the connecting bolts 24 to the third clamp assembly 19 which has been secured to the rear wall 7. Due to provision of the cushion member 23, any shock applied to the rear blade 2B during its squeegeeing operation is appropriately absorbed by the cushion member 23. In fact, in this first modification, the thickness of the rear blade 2B can be reduced to about 0.05 mm.

Referring to FIGS. 14 to 19, there is shown a second modification of the printer device which is also usable in the printer system of the present invention. In this modification, an improved stirring device is employed for adequately stirring up the viscous conductive ink 4 in the ink container chamber 5 of the housing "A".

The stirring device is installed in the ink container chamber 5 above the elongate roller 32. As will be understood from FIGS. 14 and 15, the stirring device comprises an elongate case 50 which extends between the side walls 6A and 6B of the housing "A" above the elongate roller 32. The elongate case 50 has a longitudinally extending slot in which an elongate threaded shaft 52 is installed. First and second bearings 54 and 56 are secured to the longitudinal ends of the case 50 to rotatably support the shaft 52. Meshed with the threaded shaft 52 is a nut member 58 from which a stirring arm 60 extends. As is seen from FIG. 18, the nut member 58 has two projections each having a slit 58a which is slidably engaged with one of edges of the slot of the case 50, so,that rotation of the nut member 58 about the axis of the threaded shaft 52 is suppressed. That is, when the threaded shaft 52 is rotated about its axis in one direction, the nut member 58 travels in one direction along the axis of the shaft 52 together with the stirring arm 60. As is seen from FIG. 14, the threaded shaft 52 has one end portion 54a which is exposed to the outside of the side wall 6B. The exposed end portion 54a of the shaft 52 has a gear 62 meshed with an output gear 64 which is driven by a reversible electric motor 66. Thus, when the electric motor 66 is energized to run in one direction for a given time, the stirring arm 60 moves in one direction along the axis of the shaft 52, and when thereafter the motor 66 is energized to run in a reversed direction, the stirring arm 60 moves in a reversed direction. Thus, when the motor 66 is controlled to run in one and reversed directions at a given interval, the stirring arm 60 is moved reciprocatively thereby to sufficiently stir the viscous ink 4 in the ink container chamber 5. That is, when, as is seen from FIG. 18, the ink outlet opening 3 of the housing "A" is closed, the motor 66 for the stirring arm 60 is energized and at the same time, the roller 32 is rotated in the direction of the arrow "Q". While, when, as is seen from FIG. 19, the ink outlet opening 3 is opened, the motor 66 for the stirring arm 60 is deenergized and the other motor "M" for the roller 32 is energized to run in a reversed direction. Thus, the stirring arm 60 stops and the roller 32 is rotated in the direction of the arrow "R", and thus, the viscous conductive ink 4 is forced to flow downward in and along the narrow passage 33 onto the screen plate 1.

Figure 15:
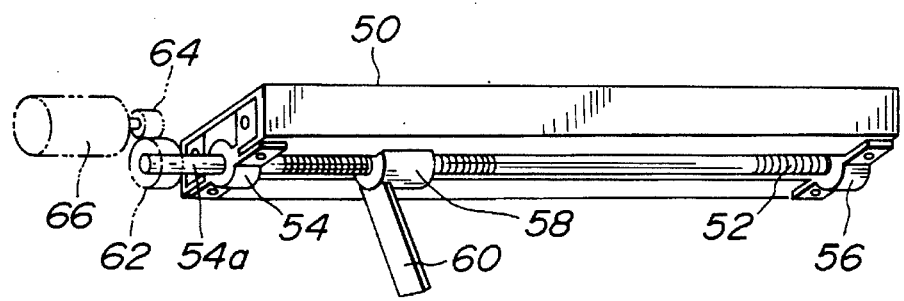
FIG. 15 is a perspective view of a stirring device employed in the second modification of the printer device.
Figure 16:
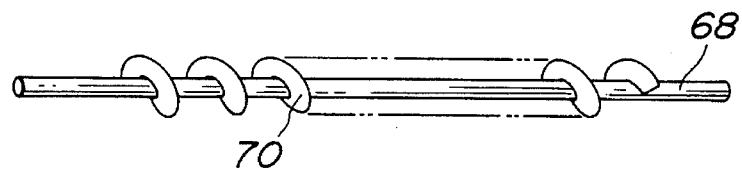
FIG. 16 is a perspective view of another stirring device employable in the second modification of the printer device.
Figure 17:
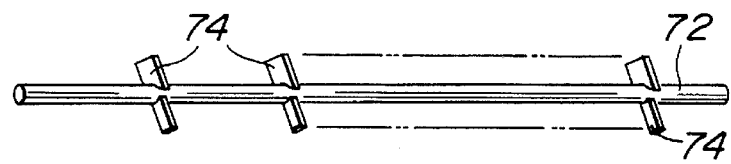
FIG. 17 is a perspective view of still another stirring device which is also employable in the second modification of the printer device.
Figure 18:
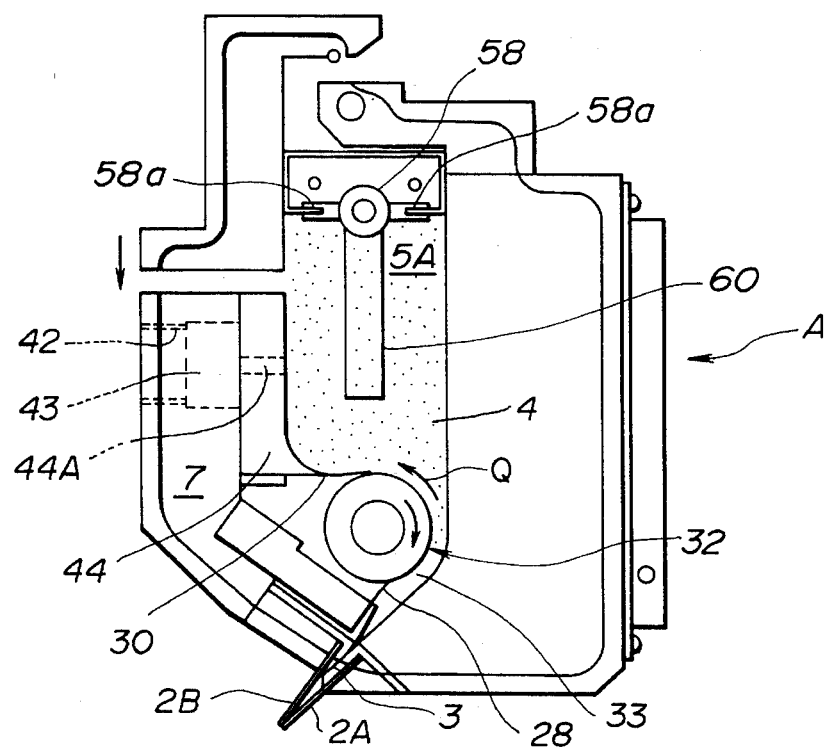
FIGS. 18 and 19 are side views of the second modification of the printer device, showing different operation conditions of the device.
Figure 19:
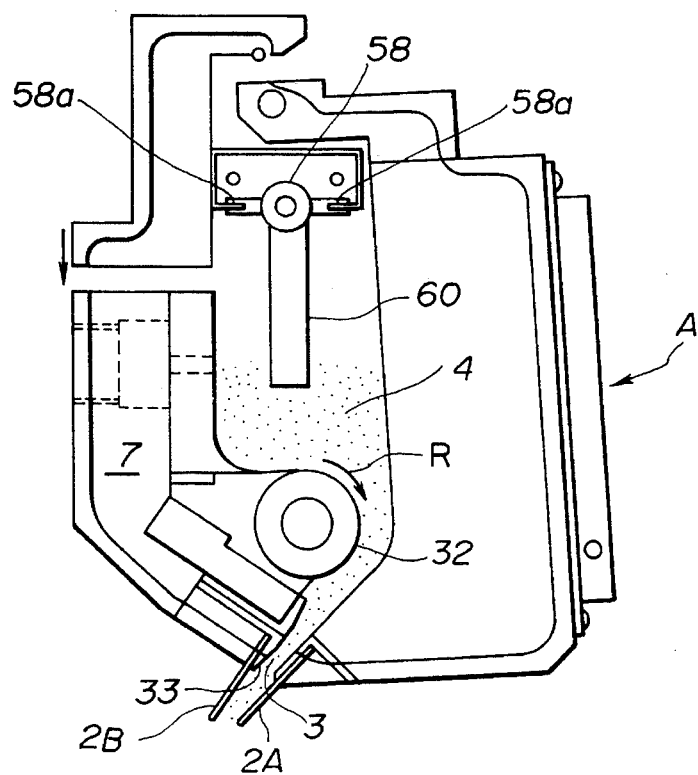

Referring back to FIGS. 16 and 17, there are shown two modifications of the stirring device of FIG. 15. In the modification of FIG. 16, a shaft 68 having a spiral blade 70 coaxially disposed thereon is used. While, in the modification of FIG. 17, a shaft 72 having a plurality of projections 74 fixed thereto is used. When the shaft 68 or 72 is rotated by means of the motor 66, the spiral blade 70 or the projections 74 sufficiently stir the viscous conductive ink 4 in the ink container chamber 5, like in the case of the device of FIG. 15. Of course, when the motor 66 is controlled to run in one and the other directions at a given interval, the stirring operation of the stirring shaft 68 or 72 is much more improved.

Referring to FIGS. 20 to 23, there is shown a screen plate cleaning device which is employed in the printer system of the present invention. The cleaning device functions to remove residual of the ink 4 left on a lower surface of the screen plate 1. Thus, the cleaning device is positioned below the screen plate 1.

Figure 20:
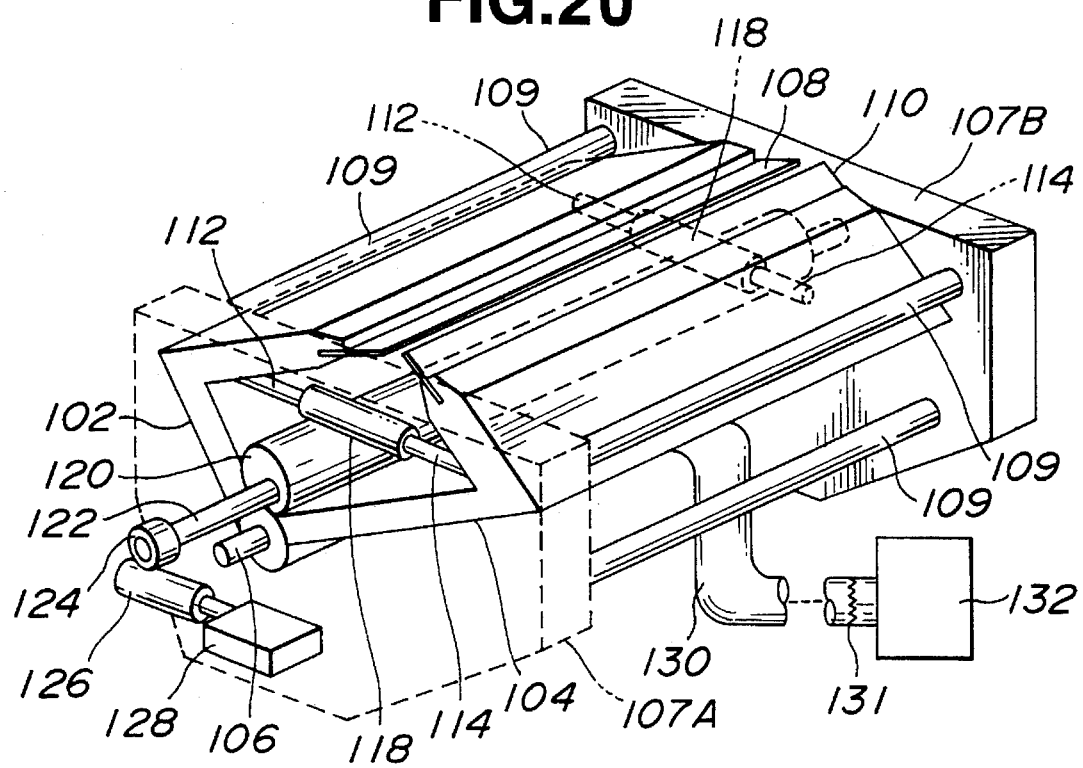
FIG. 20 is a perspective view of a screen plate cleaning device which is employed in the printer system of the present invention.
Figure 21:
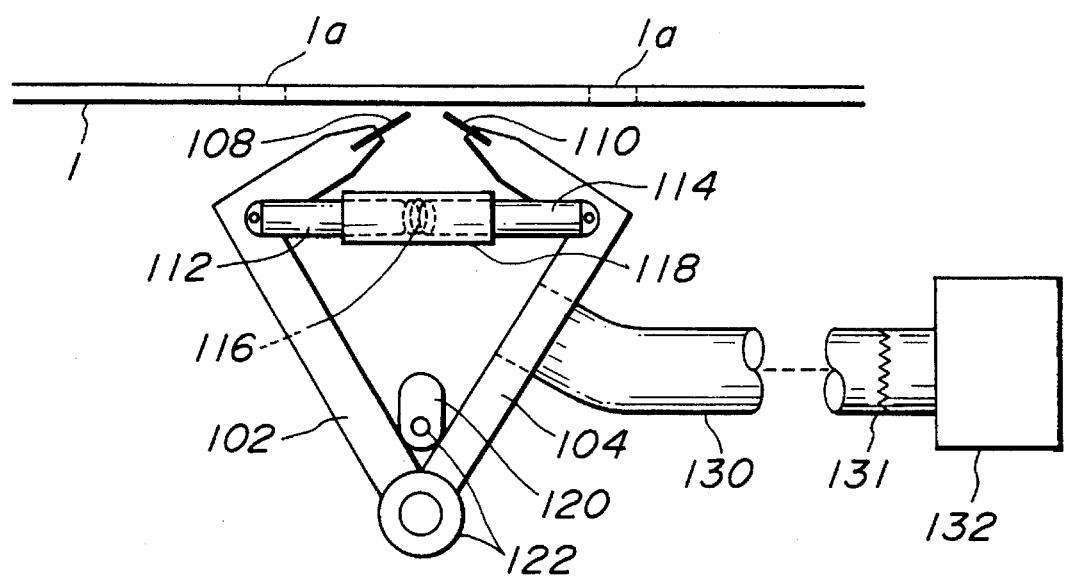
FIGS. 21 to 23 are schematically illustrated side views of the screen plate cleaning device of FIG. 20, showing different operation conditions of the same respectively.
Figure 22:
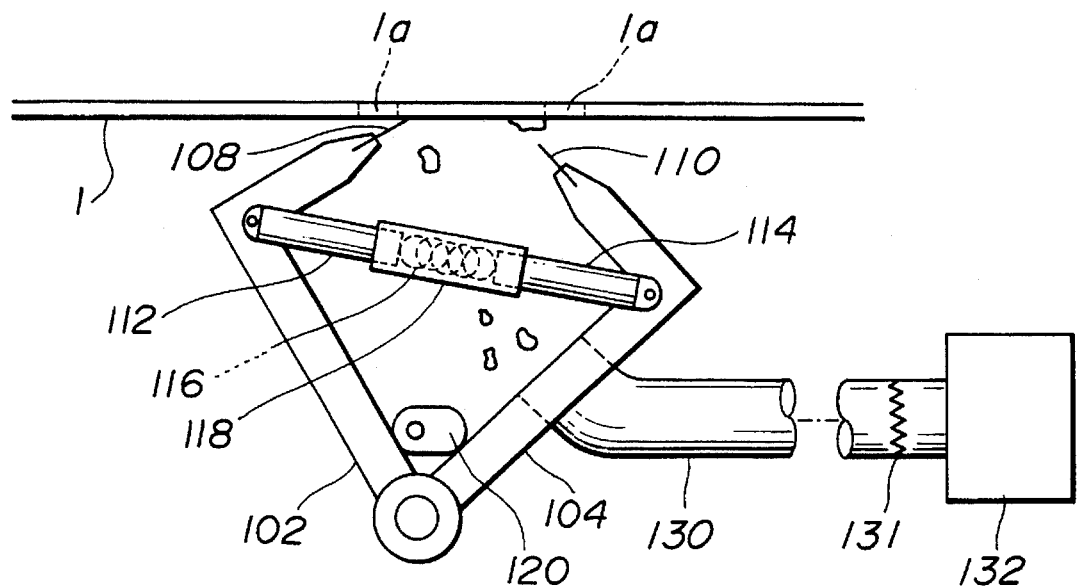
Figure 23:
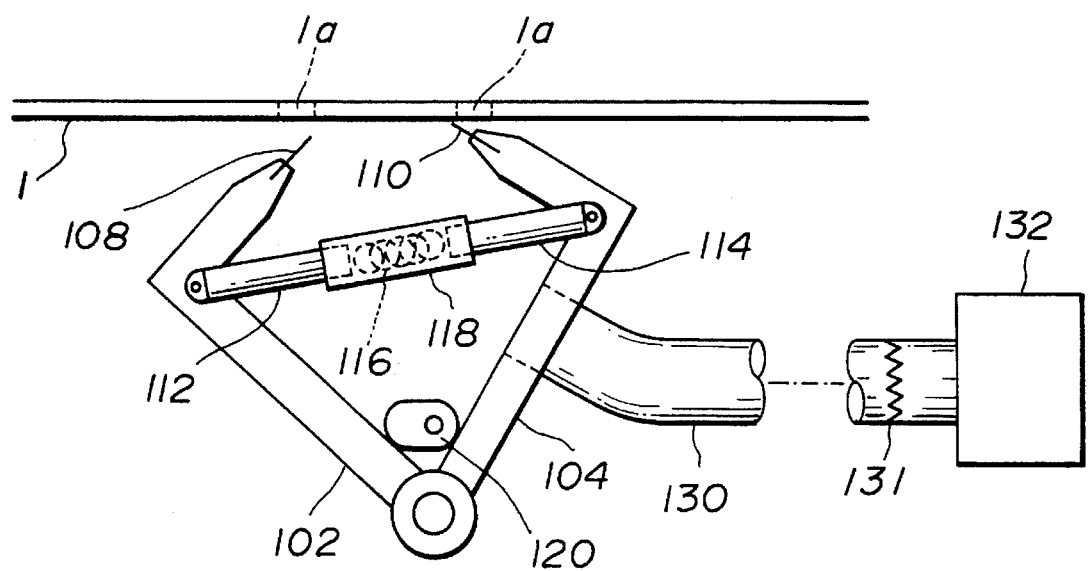

As is seen from FIG. 20, the cleaning device comprises a pair of holding blocks 102 and 104 each having a generally L-shaped cross section. These holding blocks 102 and 104 are pivotally connected at their base ends by means of a pivot shaft 106 in such a manner that their leading end portions extend toward each other. The pivot shaft 106 has both ends pivotally supported by side walls 107A and 107B which are united by means of a plurality of strut members 109. The leading end of each holding block 102 or 104 has a slit with which a scraping blade 108 or 110 is tightly engaged. As is understood from FIG. 21, each scraping blade 108 or 110 extends toward a rear surface of the screen plate 1. The two holding blocks 102 and 104 are biased toward each other by means of two biasing devices. Each biasing device comprises first and second rods 112 and 114 which are pivotally connected to the respective holding blocks 102 and 104 at their outer ends, a spring 116 (see FIG. 21) which is interposed between the inner ends of the first and second rods 112 and 114 to pull toward each other and a cylindrical casing 118 for the spring 116. Operatively engaged with inner walls of the base portions of the paired holding blocks 102 and 104 is an elongate cam 120 which is eccentrically disposed on a cam shaft 122. The cam shaft 122 is rotatably supported by the side walls 107A and 107B. Each end of the cam shaft 122 is equipped with a worm gear 124 meshed with a worm 126 which is driven by an electric motor 128. When the cam 120 assumes its neutral position as shown in FIG. 21, the paired holding blocks 102 and 104 take their position closed wherein the leading ends thereof take their relatively near positions. When, due to energization of the electric motor 128, the cam 120 is rotated clockwise in FIG. 21 about 90 degrees in angle from the neutral position, the two holding blocks 102 and 104 take a rightwardly inclined open condition, as shown in FIG. 22, wherein the left scraping blade 108 is engaged with the lower surface of the screen plate 1. While, when the cam 120 is rotated counterclockwise in FIG. 21 about 90 degrees from the neutral position, the other scraping blade 110 becomes engaged with the lower surface of the screen plate 1, as shown in FIG. 23.

As is seen from FIG. 21, the holding block 104 is formed with an opening to which a tube 130 extending from a suction pump 132 is connected. A suitable filter 131 is connected to the tube 130 at a position upstream of the suction pump 132. When the suction pump 132 is energized, an enforced air flow is produced which flows from a slit defined by the two scraping blades 108 and 110 to the suction pump 132 through a chamber which is defined by the two holding blocks 102 and 104 and the side walls 107A and 107B. Although not shown in the drawings, a cleaning device mover is associated with the cleaning device for horizontally and reciprocatively moving the cleaning device below and along the screen plate 1 (see FIG. 2).

In the following, operation of the cleaning device will be described with reference to FIGS. 20 to 23.

When, for printing a given electric circuit pattern on an insulating base board "P" (see FIG. 1), the printer device is operated to squeeze a given amount of the viscous ink 4 onto the screen plate 1 in the above-mentioned manner, a certain residual amount of the ink 4 is inevitably left on the lower surface of the screen plate 1.

As is seen from FIG. 21, in the normal position of the cleaning device, both the scraping blades 108 and 110 are not in contact with the lower surface of the screen plate 1.

When one printing stroke of the printer is completed thereby printing a given electric circuit pattern on the insulating base board "P", the printed baseboard "P" is displaced to a rest position. Upon this, the suction pump 132 is energized and at the same time, the electric motor 128 of the cleaning device is energized to cause the two holding blocks 102 and 104 to take the rightwardly inclined open condition as shown in FIG. 22. Then, the cleaning device mover (not shown) is energized. With this, the cleaning device is moved rightward in FIG. 22 and thus the residual amount of ink 4 on the lower surface of the screen plate 1 is scraped off by the left scraping blade 108, and drawn into the tube 130, and collected by the filter 131. During movement of the cleaning device, any ink residual left in the perforations 1a of the screen plate 1 is also drawn into the filter 131 by the enforced air flow in the tube 130.

When the cleaning device comes to its rightmost position, the cleaning device mover is denergized and the motor 128 is energized to run in a reversed direction causing the holding blocks 102 and 104 to take the leftwardly inclined open condition as shown in FIG. 23. Then, the cleaning device mover is energized to move the cleaning device leftward. With this, the lower surface of the screen plate 1 is scraped by the right scraping blade 110. Of course, during this movement of the cleaning device, the ink residual left in the perforations 1a of the screen plate 1 is drawn into the filter 131.

When the cleaning device comes to its leftmost position, the cleaning device mover is deenergized, and, at the same time, the suction pump 132 is also deenergized, while the electric motor 128 is energized to cause the two holding blocks 102 and 104 to take the neutral position. Then, the cleaning device mover is energized to move the cleaning device to the original rest position.

Referring to FIGS. 24 to 28, there is shown a first modification of the screen plate cleaning device which is also employable in the printer system of the present invention.

As will become apparent as the description proceeds, the modified cleaning device has an additional function to wash the lower surface of the screen plate 1 with organic solvent.

Figure 24:
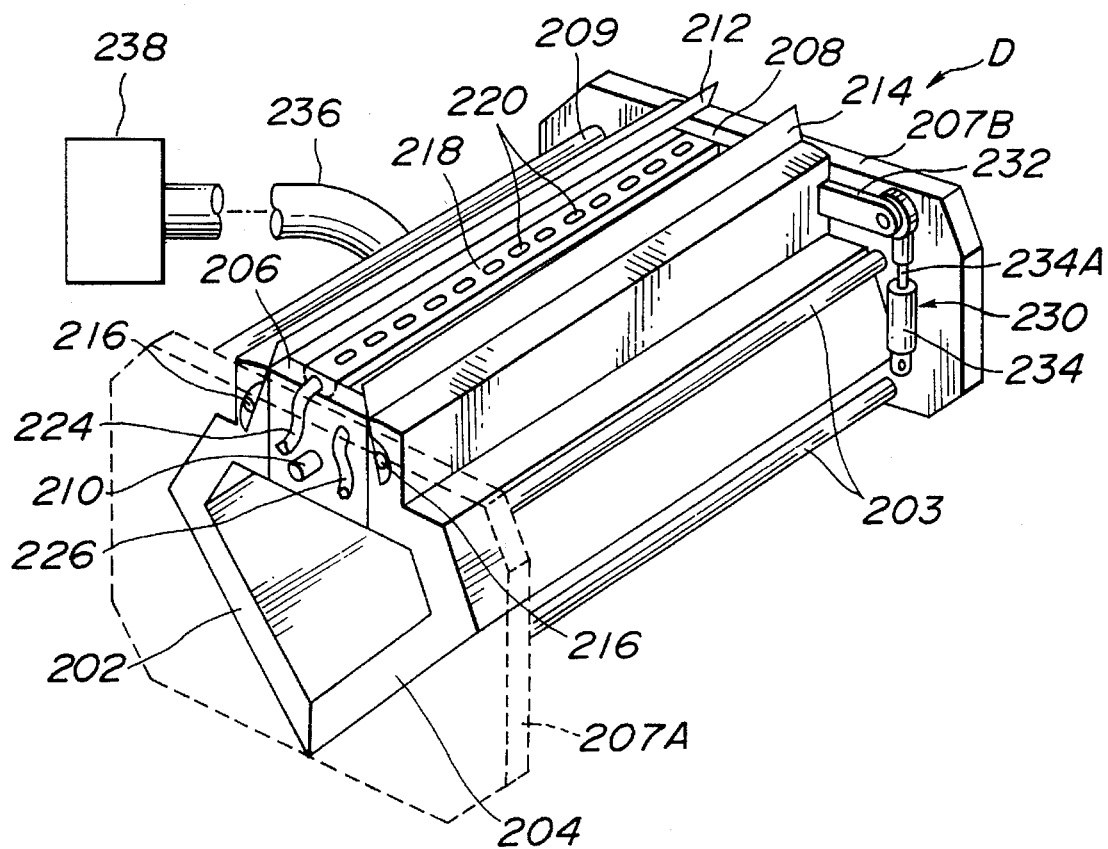
FIG. 24 is a perspective view of a first modification of the screen plate cleaning device which is also employable in the printer system of the present invention;.
Figure 25:
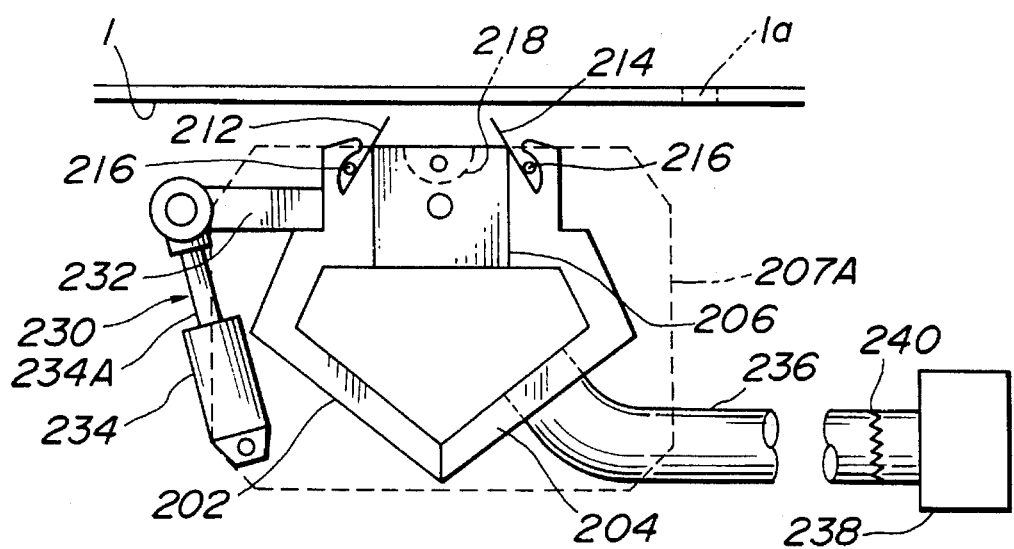
FIGS. 25 to 27 are schematically illustrated side views of the screen plate cleaning device of FIG. 24, showing different operation conditions of the same respectively.

As is seen from FIGS. 24 and 25, the modified cleaning device comprises a pair of holding blocks 202 and 204 each having a generally L-shaped cross section. These holding blocks 202 and 204 are united to constitute an elongate channel member. Upper end portions of the holding blocks 202 and 204 have at longitudinal both ends, respective, rectangular plates 206 and 208 disposed tightly therebetween. The plates 206 and 208 have aligned pins 210, which are rotatably received in respective openings formed in side walls 207A and 207B that are united by means of a plurality of strut members 209. Thus, a chamber unit consisting of the holding blocks 202 and 204 and the rectangular plates 206 and 208 is permitted to pivot relative to the fixed side walls 207A and 207B. The leading end of each holding block 202 or 204 has a groove with which a scraping blade 212 or 214 is engaged. Stopper rods 216 are received in the respective grooves to detachably hold the scraping blades 12 and 214.

An elongate hollow member 218 of semicircular cross section extends between the rectangular plates 206 and 208.

Figure 28:
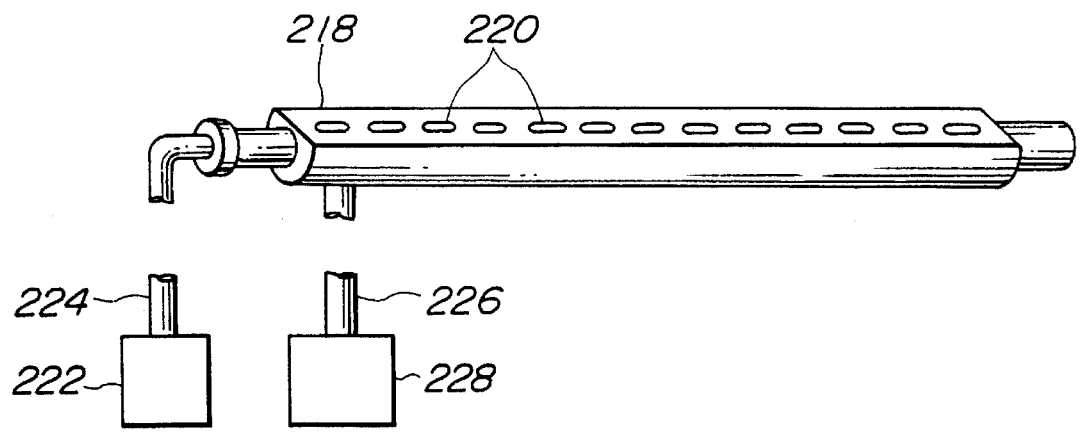
FIG. 28 is a perspective view of an essential part of the cleaning device of FIG. 24.

As shown in, FIG. 28, the hollow member 218 is formed with a plurality of openings 220 at its upper flat wall. One end of the hollow member 18 is connected to a compressed air supplier 222 through a tube 224. Connected to the hollow member 218 near the end of the same is another tube 226 which extends to a container 228 for organic solvent. Although not shown in the drawing, the tube 226 has in the Hollow member 218 a nozzle exposed to the path of a compressed air supplied by the air supplier 222. Thus, when the compressed air supplier 222 is energized to produce a compressed air flow in the hollow member 218, the organic solvent is drawn into the air path and discharged through the openings 220.

Figure 26:
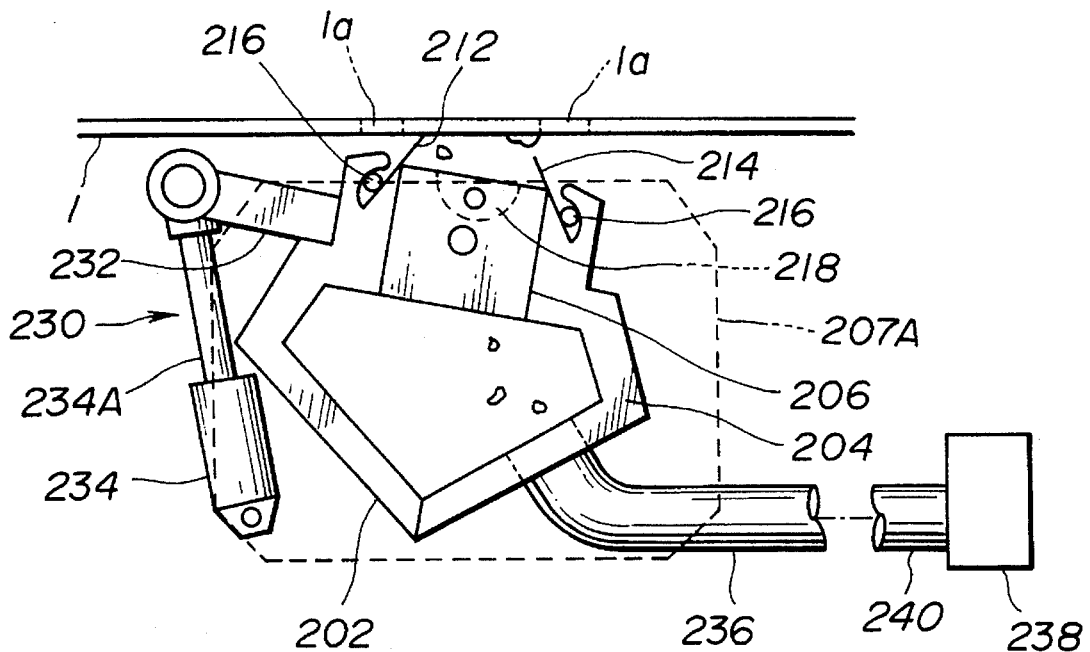
Figure 27:
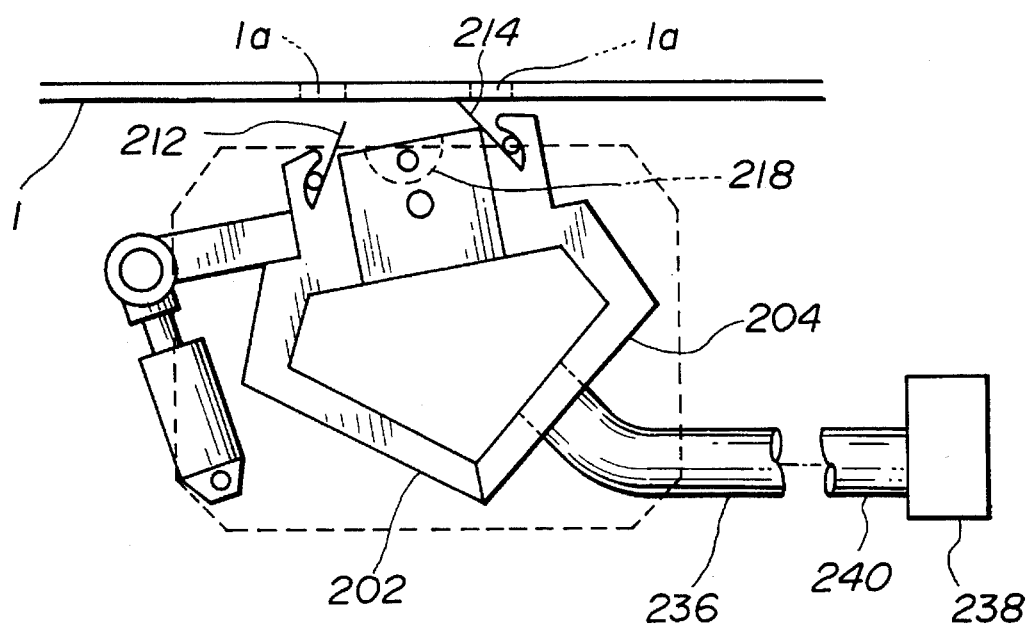

Referring back to FIGS. 24 and 25, a pivot mechanism 230 is employed for pivoting the elongate channel member relative to the side walls 207A and 207B. (It is to be noted that FIGS. 25, 26 and 27 are drawings taken from the direction of the arrow "D" in FIG. 24.) The pivot mechanism 230 comprises an arm 232, which is secured to an upper portion of the holding block 202, and an air cylinder, 234 which has a piston rod 234A pivotally connected to the arm 232. The air cylinder 234 is secured to the side wall 207B. When, as is seen from FIG. 25, the piston rod 234A of the air cylinder 234 is in its neutral position, the united holding blocks 202 and 204 take an upright position wherein both the scraping blades 212 and 214 are not in contact with the lower surface of the screen plate 1. When the piston rod 234A is pushed out by the air cylinder 234, the united holding blocks 202 and 204 are rotated clockwise in FIG. 25 to take a rightwardly inclined condition, as shown in FIG. 26; wherein the left scraping blade 212 is engaged with the lower surface of the screen plate 1. While, when the piston rod 234A is pulled by the air cylinder 234, the united holding blocks 202 and 204 are rotated counterclockwise to take a leftwardly inclined condition as shown in FIG. 27, wherein the right scraping blade 214 is engaged with the lower surface of the screen plate 1.

As is seen from FIG. 25, the holding block 204 is formed with an opening to which a tube 236 extending from a suction pump 238 is connected. A suitable filter 240 is connected to the tube 236 at a position upstream of the suction pump 238. Although not shown in the drawings, a cleaning device mover such as the above-mentioned mover is associated with the cleaning device for horizontally and reciprocatively moving the cleaning device below and along the screen plate 1 (see FIG. 2).

Since the operation of the modified cleaning device is very similar to that of the above-mentioned device of FIG. 20, description of the operation will be omitted except for a different operation possessed by the modified device.

That is, during rightward or leftward movement of the cleaning device, the compressed air supplier 222 is continually energized, and thus the organic solvent is continually stayed onto the lower surface of the screen plate 1. Thus, the screen plate 1 can be cleaned much more effectively in this modified case.

Figure 29:
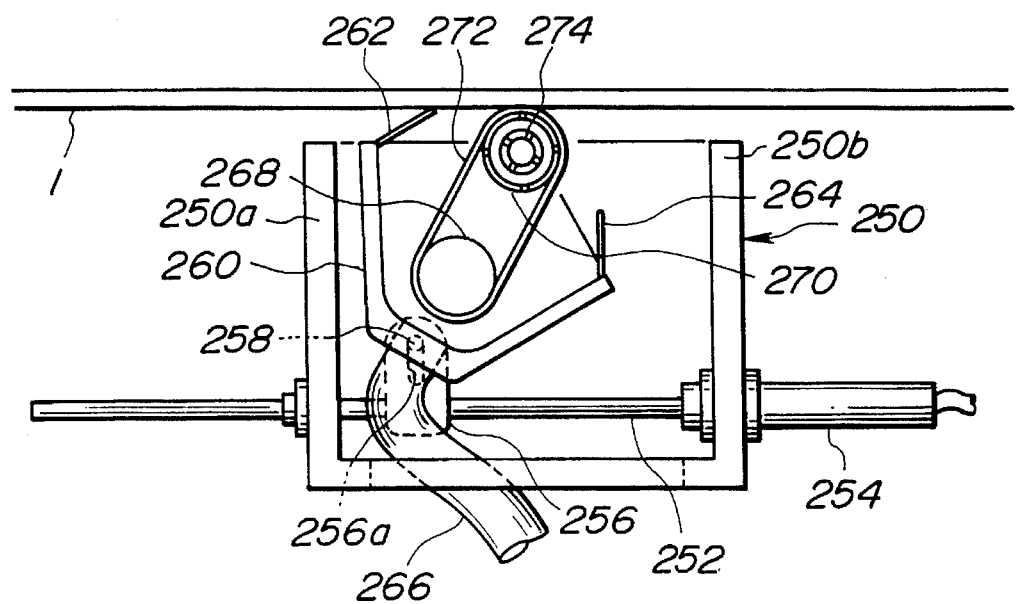
FIG. 29 is a schematically illustrated side view of a second modification of the screen plate cleaning device.

Referring to FIG. 29, there is a second modification of the screen plate cleaning device which is also employable in the printer system of the present invention.

The cleaning device of this second modification has a further function to wipe the lower surface of the screen plate 1, in addition to the functions possessed by the second modification. That is, the cleaning device comprises a support structure 250 having spaced side walls 250a and 250b. An air cylinder 254 is connected to one side wall 250b. A piston rod 252 from the air cylinder 254 extends leftward through an opening (no numeral) formed in the other side wall 250a. Thus, upon energization of the air cylinder 254, the rod 252 is shifted rightward or leftward. The rod 252 has a pin holder 256 fixed thereto. The pin holder 256 has spaced walls (no numerals) which are formed with aligned slots 256a. Slidably engaged with the aligned slots 256a is a pin 258 which is secured to a lower base portion of a generally U-shaped holding block 260. Two side walls (not shown) are secured to the sides of the holding block 260 to constitute a vessel structure. The holding block 260 has at two arm portions thereof respective scraping blades 262 and 264, as shown. The lower base portion of the holding block 260 is formed with an opening to which a tube 266 extending from a suction pump (not shown) is connected. Within the holding block 260, there are installed a drive cylinder 268 and a driven cylinder 270 around which an endless belt 272 made of a suitable cloth extends. The drive cylinder 268 is connected to an electric motor (not shown), so that upon energization of the motor, the endless cloth belt 272 runs in a given direction. Within the driven cylinder 270, there is coaxially disposed an inner cylinder 274. The inner cylinder 274 and the driven cylinder 270 are formed with a plurality of openings at their cylindrical walls, as shown. Although not shown in the drawing, one end of the inner cylinder 274 is connected to a container of an organic solvent, while, one end of the driven cylinder 270 is connected to a compressed air supplier. Thus, when the compressed air supplier is energized, the organic solvent in the container is drawn into the driven cylinder 270 and into the cloth belt 272 through the openings of the driven cylinder 270. This means that the cloth belt 272 becomes wet with the solvent.

When cleaning of the screen plate 1 is needed, the cleaning device is moved rightward or leftward with one scraping blade 262 or 264 raised, as shown. During this movement of the cleaning device, the endless cloth belt 272 is driven by the motor, the driven cylinder 270 is fed with the compressed air from the compressed air supplier, and the suction pump is operated. Thus, the lower surface of the screen plate 1 is much more effectively cleaned.

Figure 45:
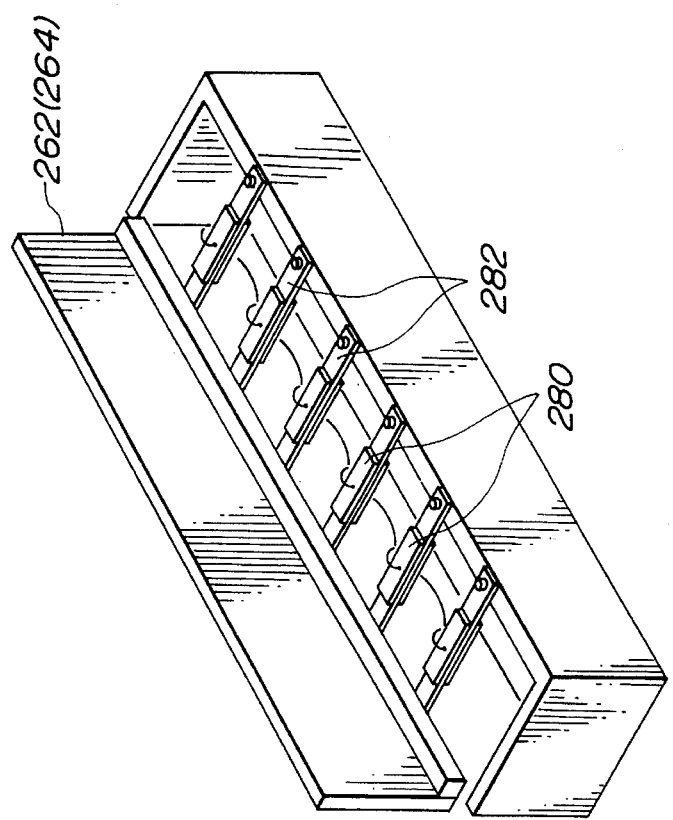
FIG. 45 is a perspective view of one scraping blade assembly usable in the screen plate cleaning device, the assembly being equipped with vibration elements.

If desired, the scraping blades 262 and 264 may be equipped with vibration elements, such as piezoelectric vibrators, or the like. In this case, the ink residual scraping effect of the blades 262 and 264 is much more improved. One example of this modification is shown in FIG. 45 wherein a plurality of piezoelectric vibrators 280 are mounted on respective spring members 282 by which the scraping blade 262 or 264 is held.

Figure 30:
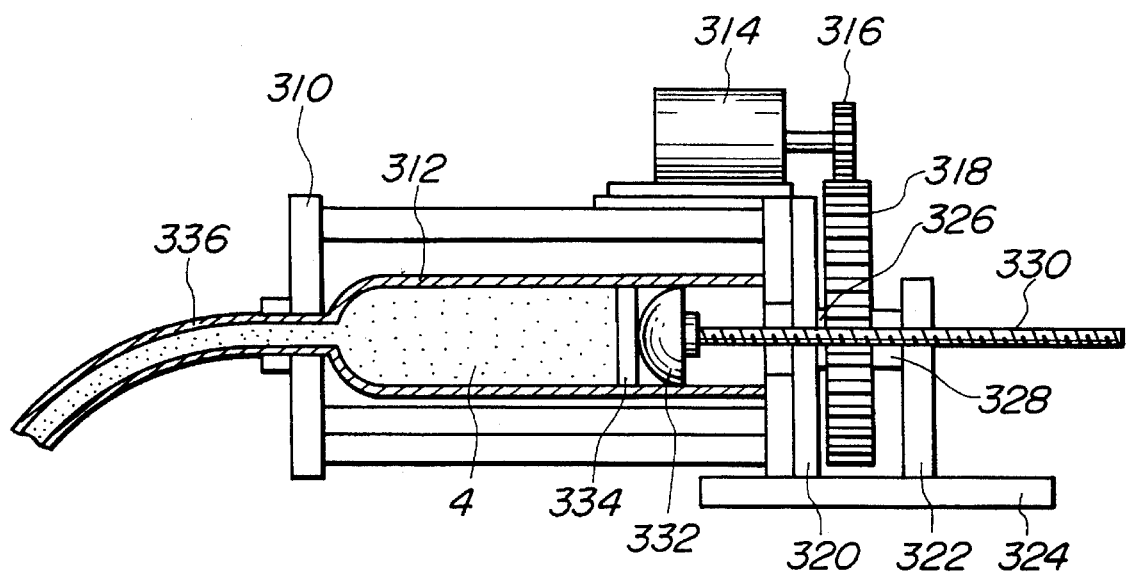
FIG. 30 is a sectional view of an ink supplier which is employed in the printer system of the present invention.
Figure 31:
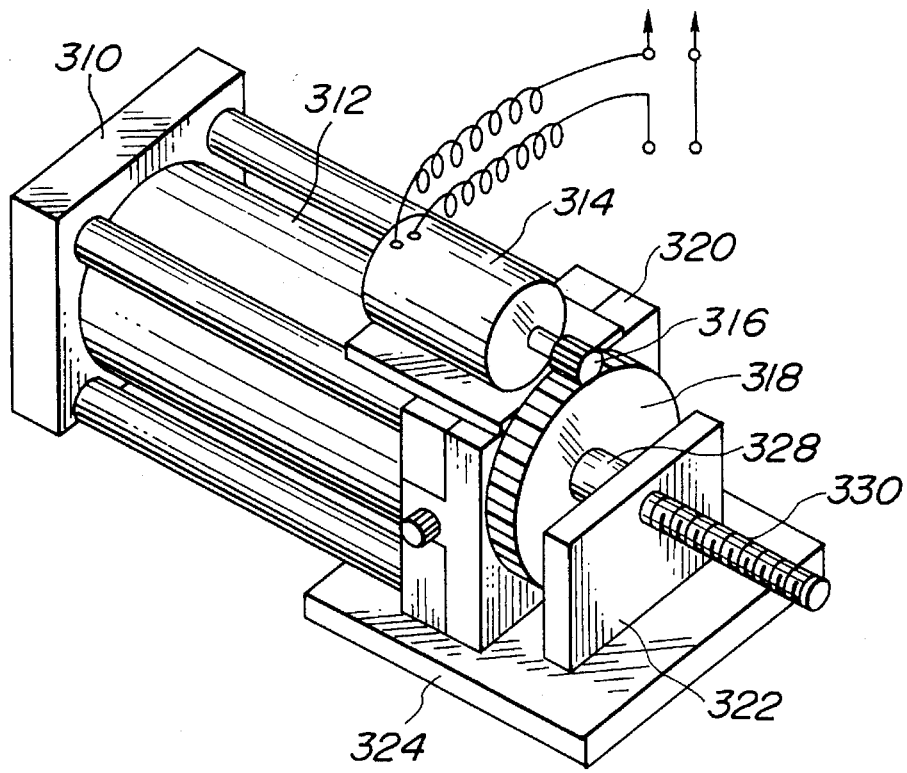
FIG. 31 is a perspective view of the ink supplier.

Referring to FIGS. 30 and 31, there is shown an ink supplier which is employed in the printer system of the present invention.

The printer supplier shown in the drawings comprises a cartridge holder 310 by which an ink cartridge 312 is detachably held. The holder 310 has an electric motor 314 mounted on one longitudinal end thereof. The motor 314 has an output gear 316 meshed with a larger gear 318 which is rotatably held between two supporting walls 320 and 322, which are connected to the cartridge holder 310 through a base plate 324. For assuring a smoothed rotation of the larger gear 318 relative to the supporting walls 320 and 322, washers 326 and 328 are disposed therebetween. The larger gear 318 has a threaded center opening (no numeral) through which a threaded rod 330 passes and with which the threaded rod 330 is operatively engaged. Although not shown in the drawings, a stopper is associated with the threaded rod 330 to prevent rotation of the same about its axis. The threaded rod 330 has a pivotal head 332 which is inserted into the ink cartridge 312. Designated by numeral 334 is a piston plate against which the pivotal head 332 abuts, as shown. An ink feeding tube 336 extends from a top of the ink cartridge 312 to the ink inlet opening 42 (see FIG. 1) of the printer device.

Thus, when the motor 314 is energized to run the larger gear 318 in a given direction, the threaded rod 330 and thus the head 332 connected thereto are moved into the ink cartridge 312. With this, the viscous ink 4 is pushed out into the printer device through the tube 336. The motor 314 is controlled by a control unit. That is, when the printer device carries out a given number of printing operations, the control unit issues a signal to the motor 314 to feed the printer device with a given amount of viscous ink 4. If desired, the rotation of the rod 330 may be effected by using another drive mechanism. For example, the drive mechanism may comprise a ratchet wheel connected to the rod 330, a ratchet operatively engaged with the ratchet wheel and an air cylinder for reciprocatively driving the ratchet. Upon energization of the air cylinder, the ratchet is moved reciprocatively and thus turns the rod 330 stepwisely. Thus, the rod 330 is moved into the ink cartridge 312 to push out the viscous ink 4 into the printer device through the tube 336.

Figure 32:
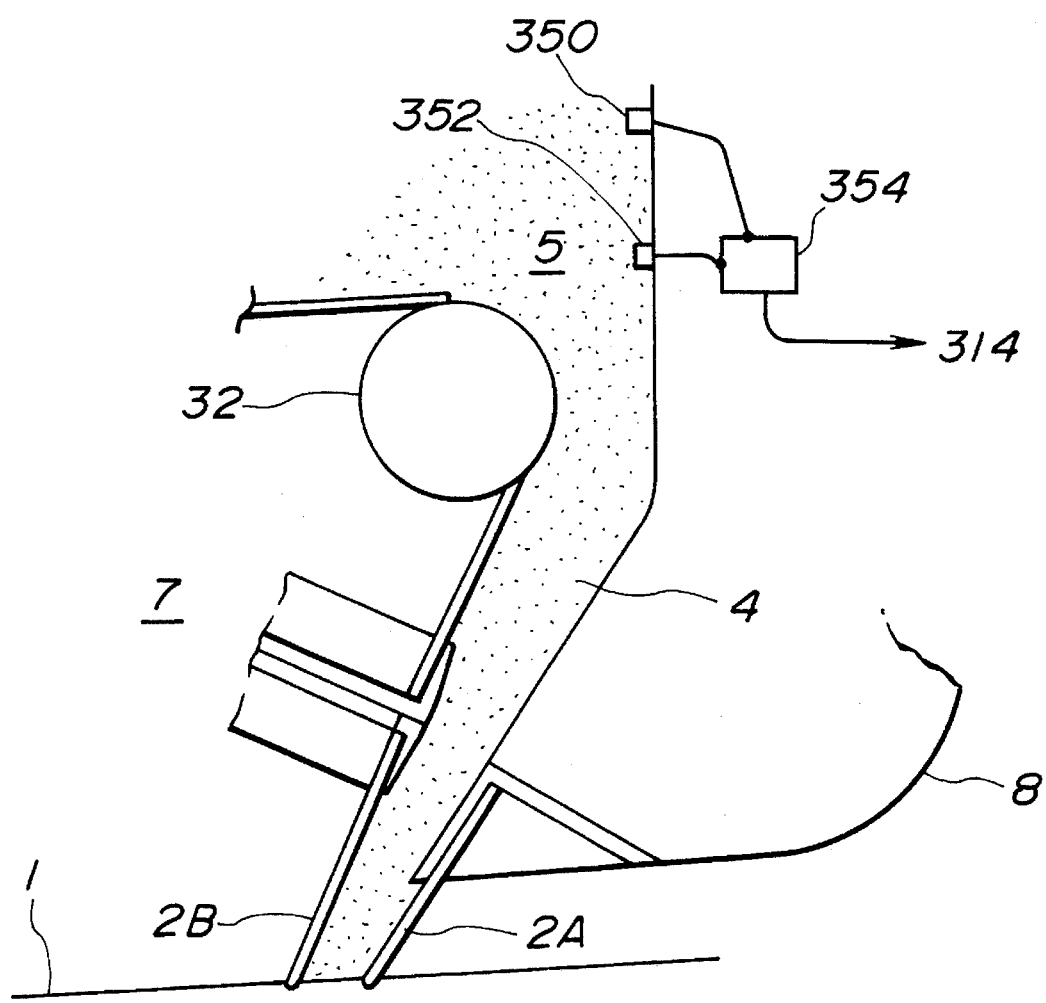
FIG. 32 is a view similar to FIG. 2, showing a measure for automatically feeding a viscous conductive ink to the printer device.

FIG. 32 shows another measure for automatically feeding a viscous conductive ink 4 to the printer device. That is, in this measure, first and second conductive members 350 and 352 are placed at vertically spaced positions in the ink container chamber 5 of the printer device. These two conductive members 350 and 352 are connected to a controller 354 which is, in turn, connected to the motor 314 of the ink supplier (see FIG. 31). That is, when the level of the ink 4 falls below the first conductive member 350, the electric resistance between the two conductive members 350 and 352 changes or increases. Sensing the change, the controller 354 energizes the motor 314 until the level of the ink 4 goes up to the first conductive member 350.

Figure 33:
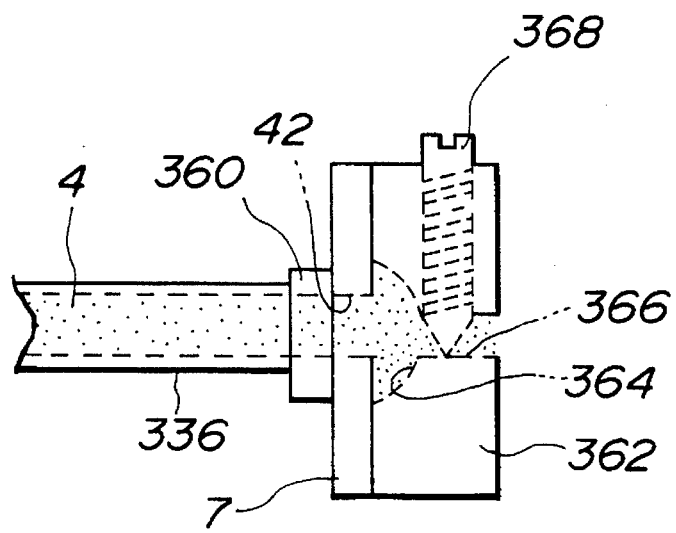
FIGS. 33 to 35 are schematic drawings showing one example for connecting an ink feeding tube from an ink supplier to the printer device.
Figure 34:
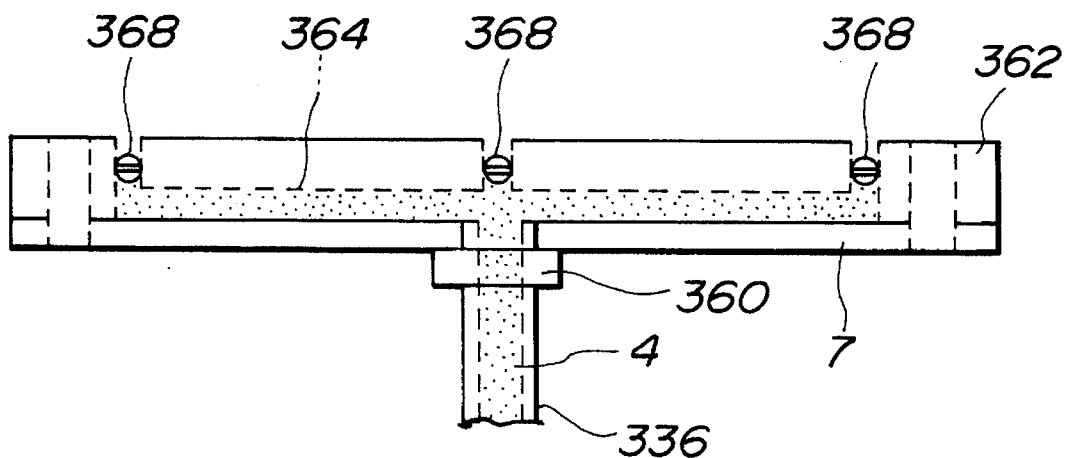
Figure 35:
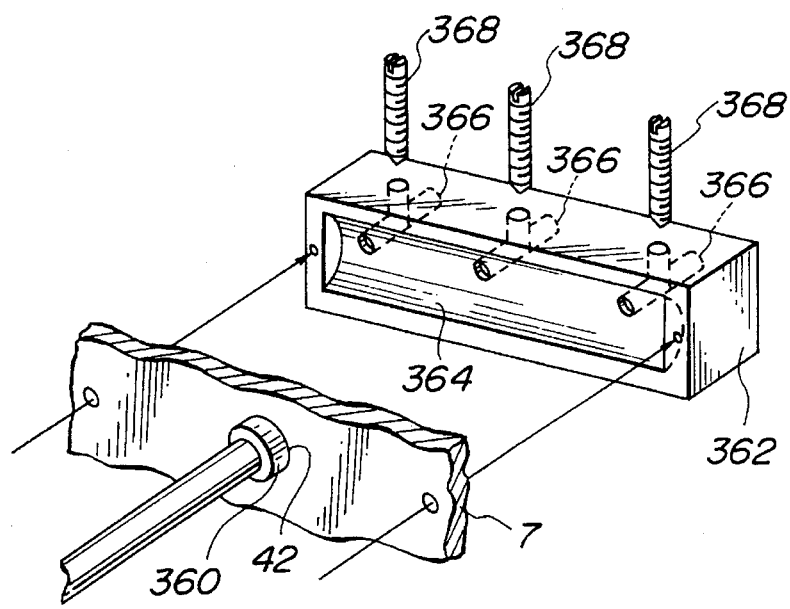

FIGS. 33 to 35 show one example for connecting the ink feeding tube 336 to the printer device. As will be seen from FIGS. 33 and 35, the tube 336 is connected to the ink inlet opening 42 of the fixed rear wall 7 by means of a connecting nut 360. Behind the rear wall 7, there is installed an elongate block 362 which is formed with an elongate recess 364 having a semicircular cross section. When the block 362 is properly fixed to the rear wall 7 by means of bolts, the ink inlet opening 42 is exposed to the recess 364 of the block 362. The block 362 is formed with a plurality of parallel passages 366 each extending from the recess 364 to the ink container chamber 5 (see FIG. 2). Each passage 366 has a threaded bore (no numeral) which extends vertically therefrom. As is best understood from FIG. 33, the threaded bores receive therein respective adjusting screws 368. Thus, by turning the adjusting screws 368 in the threaded bores, the area of each passage 366 can be adjusted. Thus, the amount of ink 4 fed to the ink container chamber 5 can be controlled or adjusted by the adjusting screws 368. That is, the viscous ink 4 can be evenly stored in the ink container chamber 5. If desired, in place of the elongate block 362, a slit cylinder may use used for achieving the even storing of the ink 4 in the ink container chamber 5. That is, the slit cylinder (viz., a cylinder member having a longitudinally extending slit formed therethrough) is rotatably disposed behind the fixed rear wall 7 below the ink inlet opening 42, and an elongate chamber member is arranged to cover the slit cylinder. The elongate chamber member has at its lower wall an elongate opening exposed to the ink container chamber 5 of the printer device. The slit cylinder ms rotated stepwisely by a suitable electric motor. For a given time, the ink 4 is fed to the chamber member with the slit cylinder keeping its closed position. With this, the chamber member is filled with the ink 4. Then, the slit cylinder is turned to its opened position causing the ink 4 to flow down through the slit into the ink, container chamber 5 of the printer device.

Figure 36:
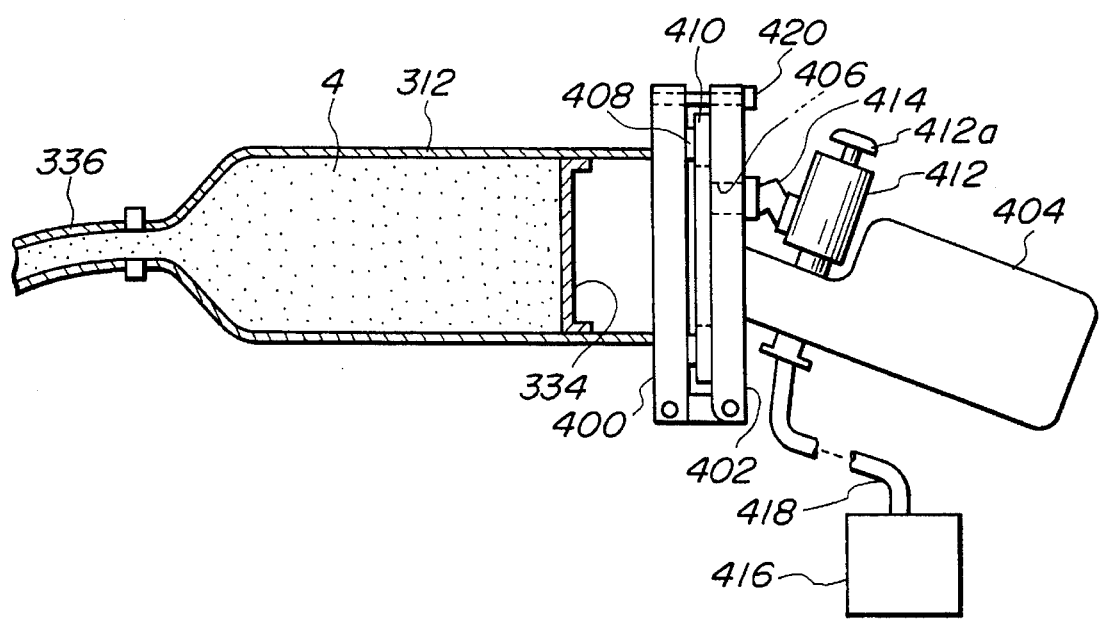
FIGS. 36 is a sectional view of a first modification of the ink supplier which is also employable in the printer system of the present invention.
Figure 37:
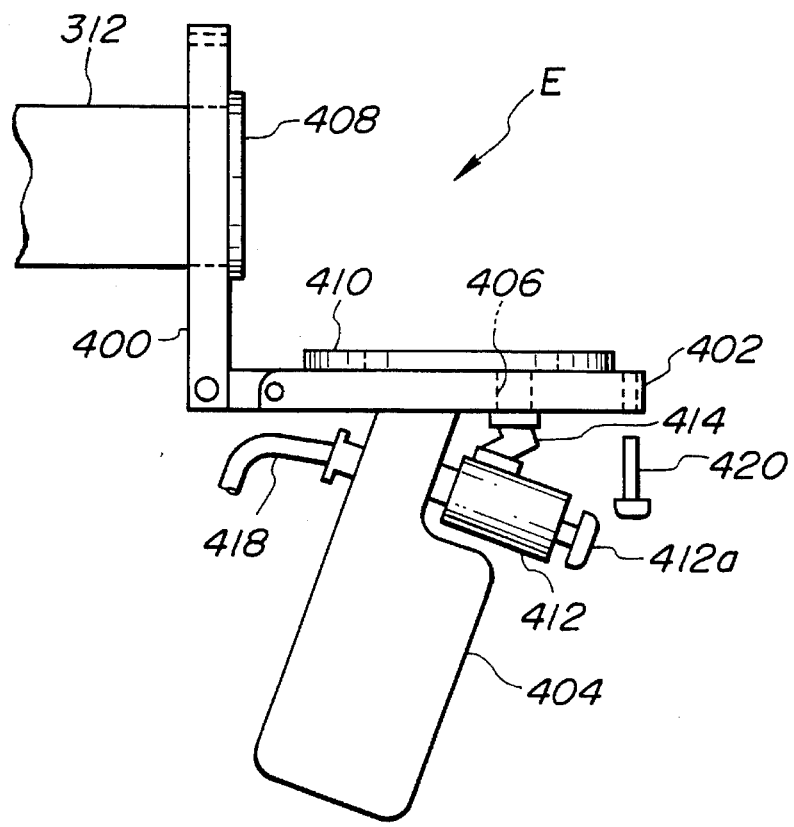
FIG. 37 is a view of the first modification, but showing an opened condition of the same.
Figure 38:
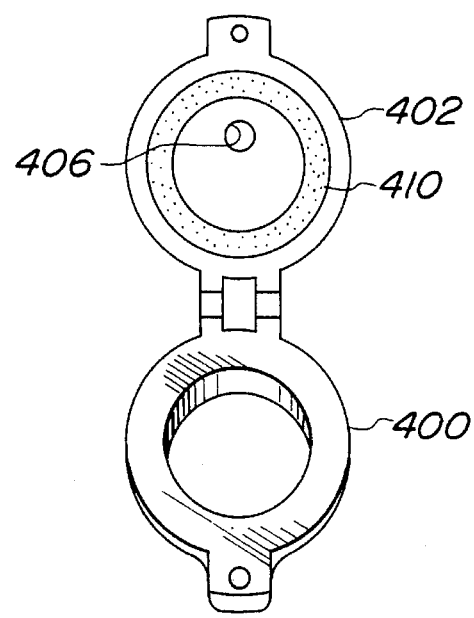
FIG. 38 is a view taken from the direction of the arrow "E" in FIG. 37.

Referring to FIGS. 36 to 38, there is shown a first modification of the ink supplier which is also employable in the printer system of the present invention.

As is best understood from FIG. 36, the modified ink supplier comprises a circular holder plate 400 which has a circular opening with which a bottom open end of the cartridge 312 is mated. Another circular plate 402 is pivotally connected to holder plate 400 by means of a known hinge mechanism. The pivotal plate 402 thus has two angular positions, one being a closed position as shown in FIG. 36, wherein the pivotal plate 402 lies on the holder plate 400, and an opened position as shown in FIG. 37, wherein the pivotal plate 402 is released from the holder plate 400. The pivotal plate 402 is equipped with a grip 404 and formed with an opening 406. First and second annular seals 408 and 410 are secured to inner surfaces of the two plates 400 and 402 respectively. Thus, when the pivotal plate 402 is in the closed position as shown in FIG. 36, the opening 406 is communicated with the bottom open end of the ink cartridge 312. Designated by numeral 420 is a bolt for detachably connecting the pivotal plate 402 to the holder plate 400. A valve 412 is mounted on the pivotal plate 402 which has an outlet connected to the opening 406 through a pipe 414 and an inlet connected to a compressed air source 416 (or compressor) through a tube 418. The valve 412 has a control button 412a for selectively opening and closing a communication between the inlet and outlet of the valve 412.

Thus, when, with the pivotal plate 402 assuming the closed position as shown in FIG. 36, the control button 412a is pushed, the compressed air from the compressed air source 416 is fed into the bottom open end of the cartridge 312. With this, the piston plate 334 in the cartridge 312 is forced to move leftward while pushing the viscous ink 4 into the printer device through the tube 336.

Referring to FIG. 39, there is shown a second modification of! the ink supplier. This modification comprises a cylindrical member 450 having a cylindrical chamber formed therein. The cylindrical member 450 has at a lower portion an ink inlet opening 451 to which an electric valve 453 is connected. Although not shown in the drawing, a pipe extends from the valve 453 to an ink tank. The cylindrical chamber has a conical outlet portion 452. The cylindrical member 450 is tightly held in a casing 454 which has at its upper end an electric fan 456 for making a positive ventilation within the casing 454. A shaft 458 extends in and along the cylindrical chamber, which has an upper end connected through a joint 460 to an output shaft of an electric motor 462, and has a lower end portion equipped with a stirring screw 464. As shown, the stirring screw 464 extends to the conical outlet portion 452. A lower end of the shaft 458 is rotatably supported by a thrust bearing 466. Denoted by numeral 468 is a weight which has a center opening through which the shaft 458 passes freely. Denoted by numeral 470 is a relief valve. The cylindrical member 450 is surrounded by a plurality of thermoelectric heating/cooling elements 472 each being equipped with a heat radiation plate 474. The conical outlet portion 452 has a tube 476 which extends to the ink inlet opening 42 (see FIG. 1) of the printer device.

Thus, when, with the viscous ink 4 left in the chamber below the weight 468, the motor 462 is energized to run the shaft 458 in a given direction, the ink 4 is forced to flow toward the tube 476. Due to the work of the weight 468 on the viscous ink 4, the flow of the ink 4 toward the tube 476 is promoted. When the amount of ink 4 in the ink chamber is reduced to a certain level, the electric valve 453 is energized to open for feeding the chamber with fresh ink from the ink tank. Due to provision of the fan 456 and the thermoelectric heating/cooling elements 472, the temperature of the ink 4 can be controlled to a desired level.

Referring to FIG. 40, there is shown a third modification of the ink supplier. Since this ink supplier is similar in construction to the above-mentioned second modification, only different portions will be described in the following.

That is, in this third modification, a plurality of stirring fins 478 are disposed on the shaft 458 in addition to the stirring screw 464. There is no need of using a weight 468. Thus, the ink inlet opening 451 can be positioned at an upper part of the cylindrical member 450.

Figure 41:
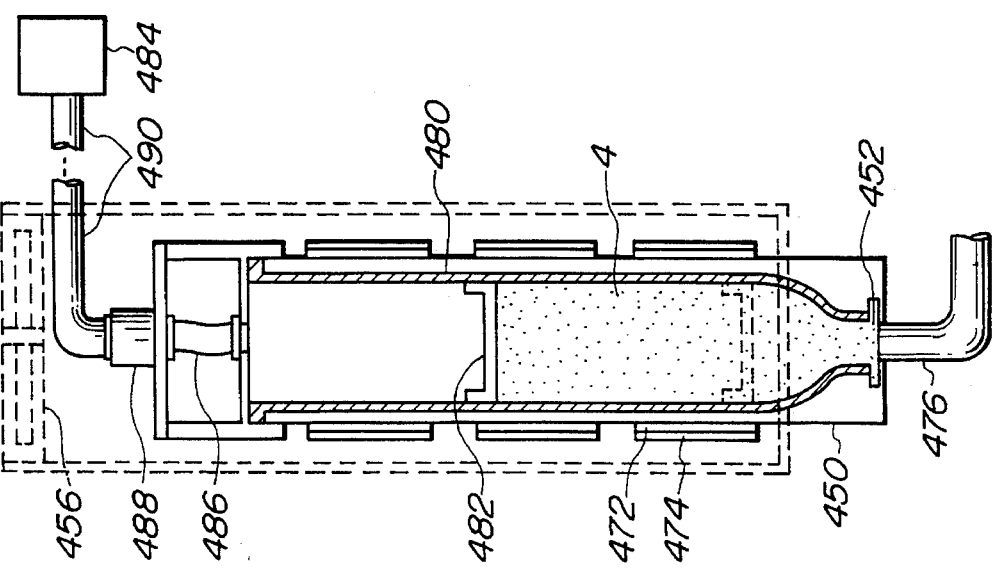

Referring to FIG. 41, there is shown a fourth modification of the ink supplier. Only portions which are different from those of the above-mentioned second modification of FIG. 39 will be described for ease of description.

In this fourth modification, an ink cartridge 480 is used, which is neatly received in the cylindrical chamber of the cylindrical member 450, as shown. Of course, an ink inlet opening 451 and an electric valve 453 connected thereto are not necessary in this modification.

Figure 42:
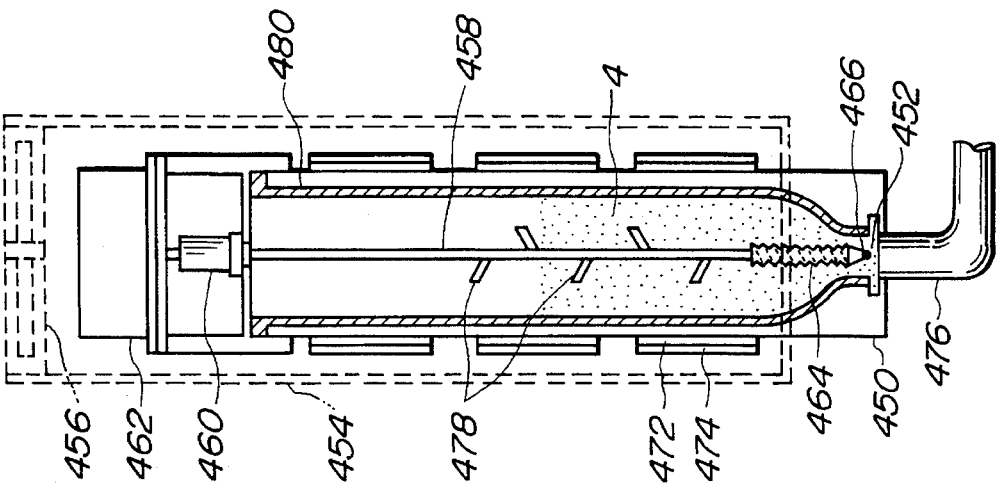

Referring to FIG. 42, there is shown a fifth modification of the ink supplier. This modification is similar to the above-mentioned third modification of FIG. 40. Thus, only different portions will be described in the following.

In this fifth embodiment, an ink cartridge 480 is used, which is neatly received in the cylindrical chamber of the cylindrical member 450, as shown. Of course, an ink inlet opening 451 and an electric valve 453 connected thereto are not necessary in this modification.

Figure 43:
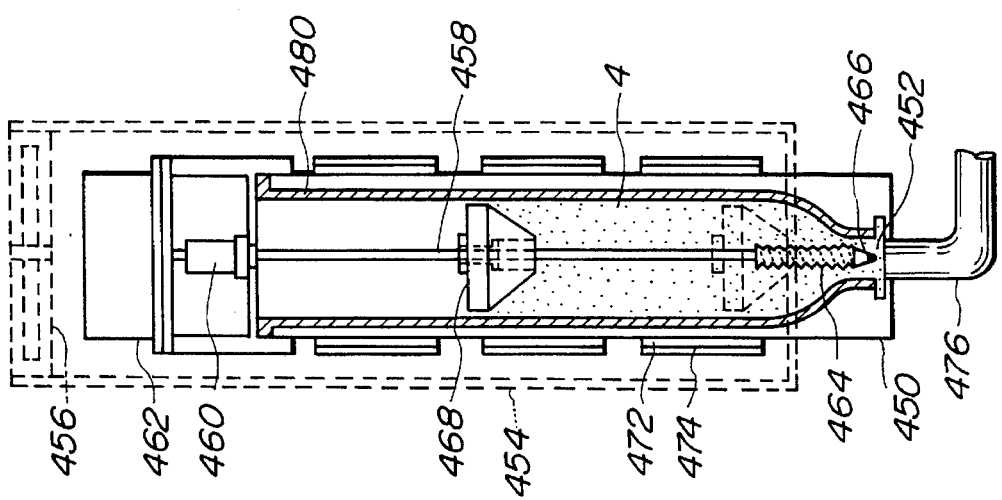

Referring to FIG. 43, there is shown a sixth modification of the ink supplier. In this modification, an ink cartridge 480 is used, which is neatly received in the cylindrical chamber of the cylindrical member 450. On the level of the viscous ink 4 in the chamber, there is placed a piston plate 482. An upper part of the cylindrical chamber of the cartridge 480, which is defined above the piston plate 482, is connected to a compressed air source 484 (or compressor) through a pipe 486, an electric valve 488 and a tube 490.

When the electric valve 488 is energized to open, the compressed air is fed to the upper part of the chamber oil the ink cartridge 480. With this, the piston plate 482 pushes the ink 4 toward printer device through the tube 476.

Figure 44:
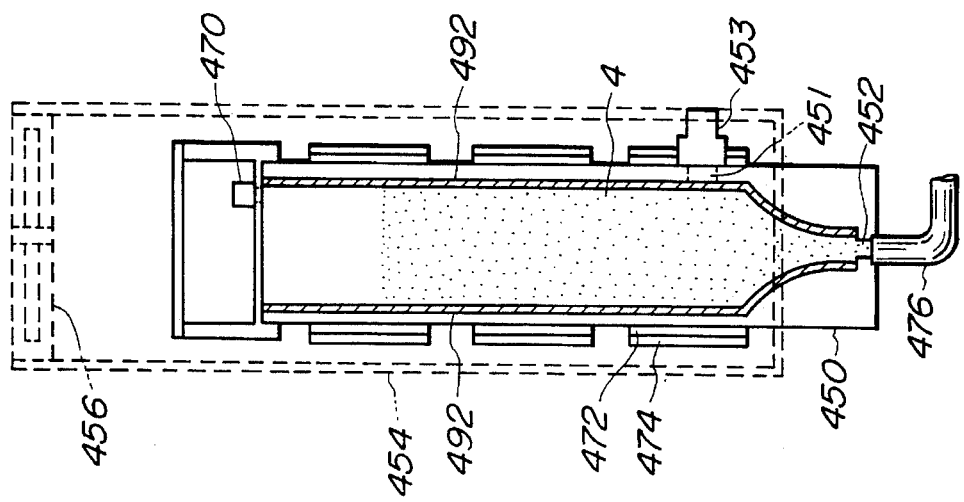

Referring to FIG. 44, there is shown a seventh modification of the ink supplier. In this modification, a plurality of vibration elements 492 are used, which are disposed on an inner wall of the cylindrical chamber of the cylindrical member 450. Due to vibration action applied to the viscous ink 4 by the vibration elements 492, the flow of the ink 4 toward the printer device smoothly carried out.

What is claimed is:

1. A printer system for printing a given pattern on a base board, comprising:

a screen plate to be positioned above a base board, said screen plate having a perforated print pattern defined thereby;

a printer proper including, housing, an ink container chamber, and an ink squeegeeing device, said ink squeegeeing device running on said screen plate pressing the same against base board while squeegeeing a given amount of viscous ink onto an upper surface of said screen plate, said ink squeegeeing device including first and second inclined blades that define an ink outlet opening of said ink container chamber, said first and second inclined blades having respective tips which are pressed against the upper surface of said screen plate when said ink squeegeeing device runs for effecting a printing, and a shutter mechanism for selectively opening and closing said ink outlet opening, said shutter mechanism including a fixed wall of said housing of said printer proper, said fixed wall having said second inclined blade connected thereto;

a pivotal wall of said housing, said pivotal wall being pivotal relative to said fixed wall and having said first inclined blade connected thereto; and drive means for pivoting said pivotal wall;

a cleaning device for cleaning residual ink left on a lower surface of said screen plate; and an ink supplier for feeding said ink container chamber of said printer proper with a fresh viscous ink when needed.

2. A printer system as claimed in claim 1, in which said drive means comprises:

an air cylinder mounted to said fixed wall of said printer proper;

a piston rod reciprocatively actuated by said air cylinder;

a bell crank pivotally connected to said fixed wall, said bell crank having one end pivotally connected to said piston rod and the other end pivotally and slidably connected to said pivotal wall.

3. A printer system as claimed in claim 1, in which said printer proper further comprises:

first and second partition blades each having one end secured to said fixed wall and the other end pressed against a roller; and two leak stoppers mounted to said printer proper in a manner to hermetically contact with longitudinal ends of said first and second inclined blades.

4. A printer system for printing a given pattern on a base board, comprising:

a screen plate to be positioned above a base board, said screen plate having a perforated print pattern defined thereby;

a printer proper including an ink container chamber and an ink squeegeeing device, said ink squeegeeing device running on said screen plate pressing the same against said base board while squeegeeing a given amount of viscous ink onto an upper surface of said screen plate;

a cleaning device for cleaning residual ink left on a lower surface of said screen plate; and an ink supplier for feeding said ink container chamber of the printer proper with an fresh viscous ink when needed, wherein said cleaning device comprises:
  a holding unit which is pivotally arranged at a position below said screen plate;
  first and second scraping blades held by said holding unit, one of said first and second scraping blades being brought into contact with a lower surface of said screen plate when said holding unit is inclined by a pivot device; and
  means for moving said holding unit along the axis of said screen plate.

5. A printer system as claimed in claim 4, in which said cleaning device further comprises:
  a suction pump;
  a tube extending from an interior of said holding unit to said suction pump; and
  a filter disposed in said tube.

6. A printer system as claimed in claim 5, in which said holding unit comprises:
  a first holding block including a lower portion and an inner wall, said first holding block having said first scraping blade connected thereto;
  a second holding block including a lower portion and an inner wall, said second holding block having said scraping block connected thereto;
  means for pivotally connecting said lower portions of said first and second holding blocks; and
  biasing means for biasing said first and second holding blocks toward each other.

7. A printer system as claimed in claim 6, in which said pivot device comprises:
  a cam having an outer surface which contacts with said inner walls of said first and second holding, blocks;
  a cam shaft on which said cam is eccentrically mounted;
  a worm gear connected to said cam shaft;
  a worm meshed with said worm gear; and
  an electric motor having an output shaft on which said worm is disposed.

8. A printer system as claimed in claim 5, in which said cleaning device further comprises solvent applying means for applying an organic solvent to said lower surface of said screen plate.

9. A printer system as claimed in claim 8, in which said solvent applying means comprises:
  an elongate hollow member installed in said interior of said holding unit, said hollow member being formed with a plurality of openings which are to be directed toward said lower surface of said screen plate;
  a compressed air supplier for supplying a compressed air to said elongate hollow member;
  a nozzle installed in said elongate hollow member and exposed to the path of the compressed air; and
  a container of organic solvent which is connected to said nozzle.

10. A printer system as claimed in claim 9, in which said cleaning device further comprises:
  an endless cloth belt which has an outer surface contactable with said lower surface of said screen plate;
  drive means for turning said endless cloth belt along a given way.

11. A printer system as claimed in claim 10, in which said elongate hollow member is surrounded by said endless cloth belt.

12. A printer system as claimed in claim 4, in which said first and second scraping blades are respectively equipped with vibration elements.

13. A printer system for printing a given pattern on a base board, comprising:
  a screen plate to be positioned above a base board, said screen plate having a perforated print pattern defined thereby;
  a printer proper including, an ink container chamber and an ink squeegeeing device, said ink squeegeeing device running on said screen plate pressing the same against said base board while squeegeeing a given amount of viscous ink onto an upper surface of said screen plate;
  a cleaning device for cleaning residual ink left on a lower surface of said screen plate; and
  an ink supplier for feeding said ink container chamber of the printer proper with a fresh viscous ink when needed, wherein said first ink supplier comprises:
  first means for defining a cylindrical chamber in which a fresh viscous ink is to be contained;
  a tube connecting said cylindrical chamber to the ink container chamber of said printer proper; and
  second means for forcing said fresh viscous ink to flow toward said ink container chamber through said tube, said second means including a piston plate slidably received in said cylindrical chamber; and an electrically actuated drive means for pushing said piston plate, and wherein said drive mans comprises:
  a threaded rod having a pivotal head received in said cylindrical chamber;
  a larger gear having a threaded opening with which said threaded rod is meshed;
  an output gear meshed with said larger gear; and
  an electric motor for driving said output gear.

14. A printer system for printing having a given pattern on a base board, comprising:
  a screen plate to be positioned above a base board, sand screen plate having a perforated print pattern defined thereby;
  a printer proper including an ink container chamber and an ink squeegeeing device, said squeegeeing device running on said screen plate pressing the same against said base board while squeegeeing a given amount of viscous ink onto an upper surface of said screen plate;
  a cleaning device for cleaning residual ink left on a lower surface of said screen plate; and
  an ink supplier for feeding said ink container chamber of said printer proper with a fresh viscous ink when needed, wherein said first ink supplier comprises:
  first means for defining a cylindrical chamber, without an outlet opening, in which a fresh viscous ink is to be contained;
  a tube connecting said cylindrical chamber to the ink container chamber of said printer proper; and
  second means for forcing a fresh viscous ink to flow toward said ink container chamber through said tube, said second means including
  a shaft extending in said cylindrical chamber of said first means and terminating at said outlet opening of said cylindrical chamber;
  an electric motor for rotating said shaft about its axis;
  a stirring screw mounted on the terminating portion of said shaft;

a weight having an opening through which said shaft freely passes; and temperature control means for controlling the temperature of said first means.

15. A printer system for printing having a given pattern on a base board, comprising:

a screen plate to be positioned above a base board, sand screen plate having a perforated print pattern defined thereby;

a printer proper including an ink container chamber and an ink squeegeeing device, said squeegeeing device running on said screen plate pressing the same against said base board while squeegeeing a given amount of viscous ink onto an upper surface of said screen plate;

a cleaning device for cleaning residual ink left on a lower surface of said screen plate; and an ink supplier for feeding said ink container chamber of said printer proper with a fresh viscous ink when needed, wherein said first ink supplier comprises:
  first means for defining a cylindrical chamber, with an outlet opening, in which a fresh viscous ink is to be contained;
  a tube connecting said cylindrical chamber to the ink container chamber of said printer proper; and
  second means for forcing a fresh viscous ink to flow toward said ink container chamber through said tube, said second means including:
  a shaft extending in said cylindrical chamber of said first means and terminating at said outlet opening of said cylindrical chamber;
  an electric motor for rotating said shaft about its axis;
  a stirring screw mounted on the terminating portion of said shaft;
  a plurality of projections formed on said shaft; and
  temperature control means for controlling the temperature of said first means.

16. A printer system as claimed in claim 15, in which said first means comprises an ink cartridge.

17. A printer system for printing having a given pattern on a base board, comprising:

a screen plate to be positioned above a base board, sand screen plate having a perforated print pattern defined thereby;

a printer proper including an ink container chamber and an ink squeegeeing device, said ink squeegeeing device running on said screen plate pressing the same against said base board while squeegeeing a given amount of viscous ink onto an upper surface of said screen plate;

a cleaning device for cleaning residual ink left on a lower surface of said screen plate; and an ink supplier for feeding said ink container chamber of said printer proper with a fresh viscous ink when needed, wherein said first ink supplier comprises:
  first means for defining a cylindrical chamber with an outlet opening, in which a fresh viscous ink is to be contained, said first means comprises an ink cartridge;
  a tube connecting said cylindrical chamber to the ink container chamber of said printer proper; and
  second means for forcing a fresh viscous ink to flow toward said ink container chamber through said tube, said second means including a shaft extending in said cylindrical chamber of said first means and terminating at said outlet opening of said cylindrical chamber; an electric motor for rotating said shaft about its axis; a stirring screw mounted on the terminating portion of said shaft; a weight having an opening through which said shaft freely passes; and temperature control means for controlling the temperature of said first means.

18. A cleaning device for cleaning a screen plate, comprising:

a pivotal holding unit having two upwardly extending arm portions and an interior;

first and second scraping blades respectively held by said arm portions, said blades having respective tips one of which contacts a lower surface of a screen plate when said pivotal holding unit is inclined by a pivot device;

means for moving said pivotal holding unit along the axis of said screen plate;

means for pivoting said pivotal holding unit;

a suction pump including an inlet; and means for connecting said interior of said pivotal holding unit and said inlet of said suction pump.

* * * * *